(12) United States Patent
Baraniuk et al.

(10) Patent No.: US 8,566,053 B2
(45) Date of Patent: Oct. 22, 2013

(54) METHOD AND APPARATUS FOR COMPRESSIVE PARAMETER ESTIMATION AND TRACKING

(75) Inventors: Richard G. Baraniuk, Houston, TX (US); Petros T. Boufounos, Boston, MA (US); Stephen R. Schnelle, Houston, TX (US); Mark A. Davenport, Houston, TX (US); Jason N. Laska, Houston, TX (US)

(73) Assignee: William Marsh Rice University, Houston, TX (US)

( * ) Notice: Subject to any disclaimer, the term of this patent is extended or adjusted under 35 U.S.C. 154(b) by 544 days.

(21) Appl. No.: 12/727,898

(22) Filed: Mar. 19, 2010

(65) Prior Publication Data
US 2010/0241378 A1    Sep. 23, 2010

Related U.S. Application Data

(60) Provisional application No. 61/161,753, filed on Mar. 19, 2009.

(51) Int. Cl.
*G01R 13/00* (2006.01)
*G01R 13/02* (2006.01)
*G01R 13/36* (2006.01)
*G01R 13/38* (2006.01)

(52) U.S. Cl.
USPC .................. 702/66; 702/72; 702/75; 702/76

(58) Field of Classification Search
None
See application file for complete search history.

(56) References Cited

U.S. PATENT DOCUMENTS

| | | | |
|---|---|---|---|
| 4,894,662 A | 1/1990 | Counselman | |
| 5,412,755 A | 5/1995 | Liu | |
| 5,465,321 A | 11/1995 | Smyth | |
| 6,273,571 B1 | 8/2001 | Sharp et al. | |
| 6,714,585 B1 | 3/2004 | Wang et al. | |
| 6,819,469 B1 | 11/2004 | Koba | |
| 7,271,747 B2 | 9/2007 | Baraniuk et al. | |
| 7,450,032 B1* | 11/2008 | Cormode et al. | 341/50 |
| 7,511,643 B2 | 3/2009 | Baraniuk et al. | |
| 2002/0101546 A1 | 8/2002 | Sharp et al. | |
| 2004/0263989 A1 | 12/2004 | Cobb et al. | |
| 2006/0029279 A1* | 2/2006 | Donoho | 382/232 |
| 2006/0239336 A1* | 10/2006 | Baraniuk et al. | 375/216 |
| 2007/0027656 A1* | 2/2007 | Baraniuk et al. | 702/189 |
| 2008/0228446 A1* | 9/2008 | Baraniuk et al. | 702/189 |
| 2009/0222226 A1* | 9/2009 | Baraniuk et al. | 702/66 |

OTHER PUBLICATIONS

Boufounos et al., "1-Bit Compressive Sensing", 2008, IEEE, pp. 16-21.*

* cited by examiner

*Primary Examiner* — Marc Armand
*Assistant Examiner* — Felix Suarez
(74) *Attorney, Agent, or Firm* — 24IP Law Group; Timothy R. DeWitt

(57) ABSTRACT

A method for estimating and tracking locally oscillating signals. The method comprises the steps of taking measurements of an input signal that approximately preserve the inner products among signals in a class of signals of interest and computing an estimate of parameters of the input signal from its inner products with other signals. The step of taking measurements may be linear and approximately preserve inner products, or may be non-linear and approximately preserves inner products. Further, the step of taking measurements is non-adaptive and may comprise compressive sensing. In turn, the compressive sensing may comprise projection using one of a random matrix, a pseudorandom matrix, a sparse matrix and a code matrix. The step of tracking said signal of interest with a phase-locked loop may comprise, for example, operating on compressively sampled data or by operating on compressively sampled frequency modulated data, tracking phase and frequency.

18 Claims, 14 Drawing Sheets

METHOD AND APPARATUS FOR COMPRESSIVE PARAMETER ESTIMATION AND TRACKING

CROSS-REFERENCE TO RELATED APPLICATIONS

The present application claims the benefit of the filing date of U.S. Provisional Patent Application Ser. No. 61/161,753 filed by the present inventors on Mar. 19, 2009.

The aforementioned provisional patent application is hereby incorporated by reference in its entirety.

STATEMENT REGARDING FEDERALLY SPONSORED RESEARCH OR DEVELOPMENT

The present inventions was made with government support under the following government grants or contracts: DARPA/ONR Grant No. N66001-08-1-2065, DARPA/SPAWAR Grant No. N66001-061-2011 and National Science Foundation Grant No. CCF 0431150.

BACKGROUND OF THE INVENTION

1. Field of the Invention

Many applications in communications and signal processing require that the parameters of a signal be estimated and tracked over time.

One particularly important example in radio communications is frequency and phase tracking of a complex-valued sinusoidal signal $$s(t)=Ae^{j(2\pi ft+\theta)}, \quad (1)$$

or a real-valued sinusoidal signal $$s(t)=A\cos(2\pi ft+\theta), \quad (2)$$

where A is the amplitude, $j=\sqrt{-1}$, f is the frequency of the sinusoid in Hz, t represents time in seconds, and $\theta$ is the phase.

It is often useful to estimate the frequency f and phase $\theta$ of a received version x(t) of such as sinusoid that has been corrupted by some linear or nonlinear transformation, interference, and/or noise. This estimation plays an important role in many radio receivers, for example, to estimate the carrier frequency of a radio transmission for subsequent demodulation of some message signal (see John G. Proakis and Masoud Salehi. "Communication Systems Engineering, Second Edition," Prentice Hall, New Jersey, 2002). Additional applications of such parameter estimation and tracking include but are not limited to: ultrasound imaging (see C. Bartoletti, M. Caciotta, and F. Leccese (Italy), "New PLL System to High Accuracy Ultrasound Measurement," in *Circuits, Signals, and Systems* (449)-2004), satellite communication (see Seki Kazuhiko and Kato Shuzo, "A Self Frequency Preset PLL Synthesizer (Special Issue on Satellite Communications Networking and Applications)," in *IEICE transactions on communications*, Vol. E76-B, No. 5(19930525) pp. 473-479), and radar (see Jian Zhang, Minghui Yang, Shuqi Zheng, and Xiaowei Sun, "A low-cost Doppler radar system with 24 GHz PLL for remote detection of heart beat," in *Microwave and Optical Technology Letters*, Volume 50 Issue 12, Pages 3139-3142 Published Online: 24 Sep. 2008).

Moreover, it is often useful track changes in the frequency and phase as they become functions of time, that is, f(t) and $\theta(t)$. Without loss of generality, one typically considers tracking only $\theta(t)$, since one can incorporate changes in f(t) into $\theta(t)$. That is, changing the frequency over time by $\Delta f$ changes the phase by $\Delta f_t$. This combined estimation and tracking plays an important role in many applications, such as the demodulation of frequency modulated (FM) communication signals.

Estimation and tracking of analog signals can be performed either in the analog or digital domains (by first sampling via an analog-to-digital converter).

2. Brief Description of the Related Art

A standard and widely used method and apparatus for tracking the frequency and phase of sinusoidal and other signals is the phase locked loop (PLL) (see S. Goldman, *Phase-Locked Loop Engineering Handbook for Integrated Circuits*. Artech House, 2007). The PLL is an analog or digital (we will use the term discrete-time interchangeably) device that uses a feedback loop to continuously update an estimate of the frequency or phase (or both quantities) of the signal. One representative embodiment of a discrete-time PLL for real-valued sinusoidal signals like in equation (2) is shown in FIG. 1.

Complex-valued PLLs operate similarly. For example to track a complex signal, instead of using an oscillator that generates a sine or cosine wave ($\sin(2\pi ft+\theta(t))$ for example), the oscillator can attempt to match the phase with an exponential signal, generating $e^{-j\Theta(t)}$. Sithamparanathan Kandeepan and Sam Reisenfeld, "Phase Detector Models and Their Performances for IF/Baseband Frequency Recovery for Complex Envelope Based DSP Implemented PLL," IEEE ICCS, 2002 offers a solid explanation of operating in the complex domain, and the tradeoffs for several different models of phase detection.

Consider an oscillatory digital (discrete-time) signal x[n] whose phase one wishes to track. The PLL tracks the signal phase by generating an estimated signal u[n] (using an estimated frequency and phase) and then comparing the input and estimated signals. If the phase of the estimated signal u[n] lags behind the input signal x[n], then the PLL feedback loop advances the phase of u[n], and vice versa. The goal of the feedback loop in this case is for the estimated signal to be orthogonal to the input. For example, if the input is $\sin(\alpha)$, we want our oscillator to be at $\cos(\beta)$, where $\beta \approx \alpha$, due to the trigonometric relation, $$\sin(\alpha)\cos(\beta) = \frac{1}{2}\sin(\alpha+\beta) + 1/2\sin(\alpha-\beta). \quad (3)$$

If we multiply a sinusoidal input $\sin(2\pi f_0 t+\theta_1(t))$ by $\cos(2\pi f_1 t+\theta_2(t))$, then we obtain a high frequency component $$\frac{1}{2}\sin(2\pi(f_0+f_1)t + (\theta_1(t)+\theta_2(t)))$$

and low frequency component $$\frac{1}{2}\sin(2\pi(f_0-f_1)t + (\theta_1(t)-\theta_2(t))).$$

The high frequency component is removed by a loop filter, and if the estimate was approximately equal to the input, then the argument of $\sin(2\pi(f_0-f_1)t+(\theta_1(t)-\theta_2(t)))$, thus returning the phase difference by the approximation $\theta \approx \sin(\theta)$. This phase difference then provides the necessary information to update the oscillator, either in continuous or discrete-time.

The classical PLL of FIG. 1 has three fundamental components in its feedback loop (see Floyd M. Gardner "Phase-lock Techniques, Third Edition," Wiley, New Jersey, 2005):

Phase-Locked Oscillator: The phase locked oscillator 110 uses the current phase estimate θ(n) to generate an estimated signal to be compared to the input.

Phase Detector: The phase detector 120 estimates the phase difference between the input signal and the estimated output from the oscillator and feeds the output to the loop filter. This component is often implemented as a combination of a multiplier and a low-pass filter to approximate an inner product between the two signals.

Loop Filter: The loop filter 130 smoothes the phase estimate of the phase detector. It provides robustness to noise but also limits the ability of the PLL to track rapid changes in phase.

In the phase detector, the phase difference between x[n] and u[n] is estimated by multiplying the two signals and then low-pass-filtering the product $$\hat{\theta}[n] = \sum_k x[k]u[k]h[n-k], \qquad (4)$$

where h[n−k] is the impulse response of the low-pass filter. The output $\hat{\theta}[n]$ can be interpreted as the correlation or the inner product of x[n] with u[n] using h[−n] as the inner product kernel (see T. Jebara, R. Kondor, and A. Howard, "Probability Product Kernels," in *Journal of Machine Learning Research*, Vol 5, pg 819-844, 2004). This interpretation is the key insight that enables the generalization of the PLL in our invention.

The loop filter 130 operates on $\hat{\theta}[n]$. Among one of many possibilities for this is an exponentially decaying moving average filter. Its output is the phase estimate θ[n] that controls the oscillator. In the case of a simple first-order moving average filter, we have $$\theta[n]=\theta[n-1]+\mu\hat{\theta}[n], \qquad (5)$$

where μ is the decay rate of the exponential moving average. This filtering is usually performed to smooth the phase estimate θ[n] and stabilize the PLL in the presence of noise.

Note that, although the moving average is often described in the literature as a separate component of the PLL, its action can be incorporated in the impulse response of the low-pass filter h[n]. That is, defining the impulse response of the loop filter in equation (5) as g[n], we can compute that the estimated phase θ [n] corresponds to the inner product of x[n] with u[n] using h[−n]*g[−n] as the inner product kernel, where * denotes convolution (p[n]*z[n]=Σ$_k$p[k]z[n−k]).

The oscillator then uses the phase estimate θ[n] to produce the oscillating estimated signal x[n]=cos(2πf$_0$n+θ[n]). Here f$_0$ is the frequency of the oscillator, which is provided to PLL and should hopefully be near the frequencies of the signal being tracked. The ability to lock-on to an oscillation frequency in a large frequency band is one performance characteristics considered when designing/analyzing a PLL. If the PLL tracks both frequency and phase properly, then f$_0$ just needs to be a rough estimate of f$_c$.

Several variations of this basic design exist; for example, components such as a multiplier or a divider can be inserted between the loop filter and the oscillator in order to allow tracking of a frequency that is at a multiple of the oscillator frequency (see D. Banerjee, *PLL Performance, Simulation, and Design*, 4th ed. Dog Ear Publishing, LLC, 2006).

A PLL can be implemented in analog hardware, software, or a mixture of both. For the mixed analog/digital PLL, the input is sampled from analog to digital, and provided to a discrete-time processor, Adjustments to the design can be made to handle delays in the loop if necessary. There are also some all-digital PLLs that rely on counting clock periods and thus perform a similar tracking function but not with a broad range of input signals.

For mixed analog/digital (analog input, digital processing) and all-digital (digital input, digital processing) PLLs, the delay of the loop should be considered when designing loop components such as filters and integrators, but the fundamental ideas of phase detection, filtering, and signal generation are the same. Each component has a digital counterpart; signal generation can become sin(2πf/f$_s$n+θ[n]), where f$_s$ is the sampling frequency, filters can be designed digitally, and phase detection can be replaced with an ideal multiplier.

There has been some previous work on implementations of random sampling and simple non-uniform sampling schemes in phase-locked loops. Theoretical results of random sampling on loops such as a digital lock-in amplifier were addressed in M. O. Sonnaillon, R. Urteaga, F. J. Bonetto, M. Ordonez, "Implementation of a high-frequency digital lock-in amplifier," in *Electrical and Computer Engineering*, 2005, *Canadian Conference on*, 1229-1232 May 2005, M. O. Sonnaillon, R. Urteaga, F. J. Bonetto, and M. Ordonez, "Random sampling in high-frequency digital Lock-In amplifiers," in *X1 Reunion de Trabajo en Procsamiento de la Informacion y Control*, 752, September 2005, and M. O. Sonnaillon, R. Urteaga, and F. J. Bonetto, "High-Frequency Digital Lock-In Amplifier Using Random Sampling", in *Instrumentation and Measurement, IEEE Transactions on*, vol 57, num 3, 616-621, March 2008. M. O. Sonnaillon and F. J. Bonetto, "FPGA Implementation of a Phase Locked Loop Based on Random Sampling," in *Programmable Logic*, 2007. *SPL '07*. 2007 *3rd Southern Conference on*, 1-6, February 2007 follows up with a simple FPGA implementation of a phase-locked loop for quantized additive random sampling (ARS).

The basic effects of non-uniform sampling in PLLs have been analyzed, often in the context of considering sampling jitter. PLL's have been shown to work under these circumstances. For example, A. Weinberg and B. Liu, "Discrete Time Analyses of Nonuniform Sampling First- and Second-Order Digital Phase Lock Loops", in *Communications, IEEE Transactions on*, vol 22, num 2, pps 123-137, February 1974 addresses the issue.

Some digital PLLs attempt to sample the signal at or near zero-crossings (see Saleh R Al-Araji, Zahir M. Hussain, and Mahmoud A. Al-Qutayri, "Digital Phase Lock Loops: Architectures and Applications,"Springer, The Netherlands, 2006). Additionally the digital tan-lock loop uses the sampling from the output of the loop to adjust the new sampling time.

Compressive sensing and other demodulators differ from these schemes by taking random linear combinations of the signal inputs. The fundamental difference in underlying principle is that the measurements preserve weighted inner products, and thus do not destroy signal phase information.

Compressive Sensing and the Restricted Isometry Property

In the standard CS framework, we acquire a signal x∈$\mathbb{R}^N$ via the linear measurements $$y=\Phi x, \qquad (6)$$

where Φ is an M×N matrix representing the sampling system and y∈$\mathbb{R}^M$ is the vector of measurements acquired. For simplicity, we deal with real-valued rather than quantized measurements y. Classical sampling theory dictates that to ensure that there is no loss of information the number of samples M should be at least the signal dimension N. The CS theory, on the other hand, permits the acquisition of significantly fewer samples than N, as long as the signal x is sparse or compressible in some basis (see E. Candès, J. Romberg, and T. Tao, "Robust uncertainty principles: Exact signal reconstruction from highly incomplete frequency information," *IEEE Trans. Inform. Theory*, vol. 52, no. 2, pp. 489-509, 2006; E. J. Candès, "Compressive sampling," in *Proc. International Congress of Mathematicians*, Madrid, Spain, 2006, vol. 3, pp. 1433-1452; D. L. Donoho, "Compressed sensing," *IEEE Trans. Info. Theory*, vol. 52, no. 4, pp. 1289-1306, September 2006; and E. J. Candès and T. Tao, "Decoding by linear programming," *IEEE Trans. Inform. Theory*, vol. 51, pp. 4203-4215, December 2005).

To understand precisely how many measurements are required to enable the recovery of a signal x, we must first examine the properties of $\Phi$ that guarantee satisfactory performance of the sensing system. Candès and Tao (see E. J. Candès and T. Tao, "Decoding by linear programming," *IEEE Trans. Inform. Theory*, vol. 51, pp. 4203-4215, December 2005) introduced the restricted isometry property (RIP) of a matrix $\Phi$ and established its important role in CS. First we define to be the set of all K-sparse signals in $\mathbb{R}^N$, i.e., $$\Sigma_K = \{x \in \mathbb{R}^N : \|x\|_0 \le K\},$$

where $\|\cdot\|_0$ denotes the $l_0$ quasi-norm, which simply counts the number of non-zero entries of a vector. We say that a matrix $\Phi$ satisfies the RIP of order K if there exists a constant $\delta \in (0, 1)$, such that $$(1-\delta)\|x\|_2^2 \le \|\Phi x\|_2^2 \le (1+\delta)\|x\|_2^2 \quad (7)$$

holds for all $x \in \Sigma_K$. In other words, $\Phi$ acts as an approximate isometry on the set of vectors that are K-sparse.

It is clear that if we wish to be able to recover all K-sparse signals x from the measurements y, then a necessary condition on $\Phi$ is that $\Phi x_1 \ne \Phi x_2$ for any pair $x_1, x_2 \in \Sigma_K$ with $x_1 \ne x_2$. Equivalently, we require $\|\Phi(x_1 - x_2)\|_2^2 > 0$, which is guaranteed if $\Phi$ satisfies the RIP of order 2K with constant $\delta < 1$. Furthermore, the RIP also ensures that a variety of practical algorithms can successfully recover any compressible signal from noisy measurements. The following theorem, a slight modification of Theorem 1.2 from E. J. Candès, "The restricted isometry property and its implications for compressed sensing," in *Compte Rendus de l'Academie des Sciences, Paris, Series I*, 2008, vol. 346, pp. 589-592, makes this precise by bounding the recovery error of x with respect to the sampling noise and with respect to the $l_1$-distance from x to its best K-term approximation denoted $x_K$:

$$x_K = \arg\min_{x' \in \Sigma_K} \|x - x'\|_1.$$

Theorem 1. Suppose that $\Phi$ satisfies the RIP of order 2K with isometry constant satisfying $\delta < \sqrt{2} - 1$. Given measurements of the form $y = \Phi x + e$, where $\|e\|_2 \le \epsilon$, the solution to $$\hat{x} = \arg\min_{x' \in \mathbb{R}^N} \|x'\|_1 \text{ subject to } \|\Phi x' - y\|_2 \le \epsilon \quad (8)$$

obeys $$\|\hat{x} - x\|_2 \le C_0 \epsilon + C_1 \frac{\|x - x_K\|_1}{\sqrt{K}},$$

where $$C_0 = 4\frac{\sqrt{1+\delta}}{1-(1+\sqrt{2})\delta},$$

$$C_1 = 2\frac{1-(1-\sqrt{2})\delta}{1-(1+\sqrt{2})\delta}.$$

Note that in practice we may wish to acquire signals that are sparse or compressible with respect to a certain sparsity basis $\Psi$, i.e., $x = \Psi \alpha$ where $\Psi$ is represented as an N×N matrix and $\alpha \in \Sigma_K$. In this case we would require instead that $\Phi\Psi$ satisfy the RIP, and the performance guarantee would be on $\|\hat{\alpha} - \alpha\|_2$.

Before we discuss how one can actually obtain a matrix $\Phi$ that satisfies the RIP, we observe that we can restate the RIP in a slightly more general form. If $\delta \in (0, 1)$ and $D, F \subset \mathbb{R}^N$, we will say that a mapping $\Phi$ is a $\delta$-stable embedding of (D,F) if $$(1-\delta)\|d-f\|_2^2 \le \|\Phi d - \Phi f\|_2^2 \le (1+\delta)\|d-f\|_2^2 \quad (9)$$

for all $d \in D$ and $f \in F$. A mapping satisfying this property is also commonly called bi-Lipschitz. Observe that for a matrix $\Phi$, satisfying the RIP of order 2K is equivalent to being a $\delta$-stable embedding of $(\Sigma_K, \Sigma_K)$ or of $(\Sigma_{2K}, \{0\})$. (In general, if $\Phi$ is a $\delta$-stable embedding of (D, F), this is equivalent to it being a $\delta$-stable embedding of $(\tilde{D}, \{0\})$ where $\tilde{D} = \{d-f : d \in D, f \in F\}$. This formulation can sometimes be more convenient.) Furthermore, if the matrix $\Phi\Psi$ satisfies the RIP of order 2K then $\Phi$ is a $\delta$-stable embedding of $(\Psi(\Sigma_K), \Psi(\Sigma_K))$ or $((\Psi(\Sigma_{2K}), \{0\})$, where $\Psi(\Sigma_K) = \{x = \Psi\alpha : \alpha \in \Sigma_k\}$.

A key consequence of the RIP is that inner products are approximately preserved between any two sparse or compressible signals:

$$\langle \Phi x_1, \Phi x_2 \rangle \approx \langle x_1, x_2 \rangle. \quad (10)$$

This property ensures that the signal geometry between the signals of interest is preserved by the sampling process, i.e., (10) is an equality up to a small difference, $\pm \eta$, that can be controlled by the number of measurements.

Random Matrix Constructions

We now turn to the more general question of how to construct linear mappings $\Phi$ that satisfy (9) for particular sets D and F. While it is possible to obtain deterministic constructions of such operators, in order to obtain $\Phi$ with the fewest number of rows possible, we often turn to random matrix constructions. One of several possibilities, we will construct our random matrices as follows: given M and N, generate random M×N matrices $\Phi$ by choosing the entries $\phi_{ij}$ as independent and identically distributed (i.i.d.) random variables. For our embodiment, we will impose two conditions on the random distribution. First, we use a distribution that will yield a matrix that is norm-preserving, which will require that $$\mathbb{E}(\phi_{ij}^2) = \frac{1}{M}. \quad (11)$$

Second, we utilize a distribution that is a sub-Gaussian distribution, meaning that there exists a constant $C > 0$ such that $$\mathbb{E}(e^{\phi_{ij}t}) \le e^{C^2 t^2/2} \quad (12)$$

for all $t \in \mathbb{R}$. This says that the moment-generating function of our distribution is dominated by that of a Gaussian distribution, which is also equivalent to requiring that tails of our distribution decay at least as fast as the tails of a Gaussian distribution. Examples of sub-Gaussian distributions include the Gaussian distribution, the Rademacher distribution, and the uniform distribution. In general, any distribution with bounded support is sub-Gaussian (see V. V. Buldygin and Yu. V. Kozachenko, *Metric Characterization of Random Variables and Random Processes*, American Mathematical Society, Providence, R.I., 2000).

The key property of sub-Gaussian random variables that will be of use in our discussion is that for any $x \in \mathbb{R}^N$, the random variable $\|\Phi x\|_2^2$ is strongly concentrated about its expected value; that is, there exists a constant $c>0$ that depends only on the constant C in (12) such that $$Pr(|\|\Phi x\|_2^2 - \|x\|_2^2| \geq \delta \|x\|_2^2) \leq 2e^{-cM\delta^2}, \quad (13)$$

where the probability is taken over all M×N matrices $\Phi$ (see D. Achlioptas, "Database-friendly random projections," in *Proc. Symp. Principles of Database Systems*, 2001).

Stable Embeddings

We now provide a number of results that we will use extensively in the sequel to ensure the stability of our compressive detection, classification, estimation, and filtering algorithms.

We will start by considering the simple case where we want to have a $\delta$-stable embedding of (D, F) where $D=\{d_i\}_{i=1}^{|D|}$ and $F=\{f_j\}_{j=1}^{|F|}$ are finite sets of points in $\mathbb{R}^N$. In the case where D=F, this is essentially the Johnson-Lindenstrauss (JL) lemma (see W. B Johnson and J. Lindenstrauss, "Extensions of Lipschitz mappings into a Hilbert space," in *Proc. Conf. in Modern Analysis and Probability*, 1984, pp. 189-206; S. Dasgupta and A. Gupta, "An elementary proof of the Johnson-Lindenstrauss lemma," Tech. Rep. TR-99-006, Berkeley, Calif., 1999; and D. Achlioptas, "Database-friendly random projections," in *Proc. Symp. Principles of Database Systems*, 2001). |D| denotes the number of points in D.

Lemma 1. Let D and F be sets of points in $\mathbb{R}^N$. Fix $\delta, \beta \in (0, 1)$. Let $\Phi$ be an M×N random matrix with i.i.d. entries chosen from a distribution that satisfies (13). If $$M \geq \frac{\ln(|D||F|) + \ln(2/\beta)}{c\delta^2} \quad (14)$$

then with probability exceeding $1-\beta$, $\Phi$ is a $\delta$-stable embedding of (D, F).

Proof. To prove the result we apply (13) to the |D||F| vectors corresponding to all possible $d_i - f_j$. By applying the union bound, we obtain that the probability of (9) not holding, $\beta$, is bounded by $$\beta \leq 2|D||F|e^{-cM\delta^2}.$$

By solving for M we obtain the desired result.

We now consider the case where $D = \mathcal{R}(\Psi_J)$ and $F = \{0\}$, where $\Psi_J$ is an orthonormal basis for a K-dimensional subspace of $\mathbb{R}^N$, and $\mathcal{R}(\cdot)$ denotes the range, or column span, of an operator. Thus, we wish to obtain a $\Phi$ that preserves the norm of any vector $x \in \mathcal{R}(\Psi_J)$. At first glance, this might seem very different than the setting for Lemma 14, since the former involves an uncountable point set, and the latter deals only with embedding a finite number of points. However, we will see that the dimension K bounds the complexity of this space and thus it can be characterized in terms of a finite number of points. The following lemma follows from Lemma 5.1 in R. G. Baraniuk, M. Davenport, R. A. DeVore, and M. B. Wakin, "A simple proof of the restricted isometry property for random matrices," *Constructive Approximation*, vol. 28, no. 3, pp. 253-263, December 2008.

Lemma 2. Suppose that $\Psi_J$ is an orthonormal basis for a K-dimensional subspace of $\mathbb{R}^N$. Fix $\delta, \beta \in (0, 1)$. Let $\Phi$ be an M×N random matrix with i.i.d. entries chosen from a distribution that satisfies (13). If $$M \geq 2\frac{K\ln(42/\delta) + \ln(2/\beta)}{c\delta^2} \quad (15)$$

then with probability exceeding $1-\beta$, $\Phi$ is a $\delta$-stable embedding of $(\mathcal{R}(\Psi_J), \{0\})$.

We now observe that we can extend this result beyond a single K-dimensional subspace to all possible subspaces of K-sparse signals, i.e., $\Sigma_K$ (see R. G. Baraniuk, M. Davenport, R. A. DeVore, and M. B. Wakin, "A simple proof of the restricted isometry property for random matrices," *Constructive Approximation*, vol. 28, no. 3, pp. 253-263, December 2008).

Lemma 3. Let $\Psi$ be an orthonormal basis and fix $\delta, \beta \in (0, 1)$. Let $\Phi$ be an M×N random matrix with i.i.d. entries chosen from a distribution that satisfies (13). If $$M \geq 2\frac{K\ln(42eN/\delta K) + \ln(2/\beta)}{c\delta^2} \quad (16)$$

with e denoting the base of the natural logarithm, then with probability exceeding $1-\beta$, $\Phi$ is a $\delta$-stable embedding of $(\Psi(\Sigma_K), \{0\})$.

A similar technique has recently been used to demonstrate that random projections also provide a stable embedding of nonlinear manifolds (see R. G. Baraniuk and M. B. Wakin, "Random projections of smooth manifolds," *Foundations of Computational Mathematics*, vol. 9, no. 1, pp. 51-77, February 2009): under certain assumptions on the curvature and volume of a K-dimensional manifold $\mathcal{M} \subset \mathbb{R}^N$, a random sensing matrix with $$M = O\left(\frac{K\log(N)}{\delta^2}\right)$$

will with high probability provide a $\delta$-stable embedding of $(\mathcal{M}, \mathcal{M})$.

We will make further use of these connections in the following sections to aid in our analysis of solving inference problems using compressive measurements.

Compressive Samplers

Compressive sensing (CS) theory opens the door for alternative acquisition and sampling systems. In particular, CS allows us to achieve sub-Nyquist sampling rates and new practical sampling techniques or implementations. In this document, we discuss one way in which the discrete CS framework can be extended to the analog domain, and several new acquisition modalities which exploit the theory. Such sampling modalities include random demodulation (see J. N. Laska, S. Kirolos, M. E Duarte, T. Ragheb, R. G. Baraniuk, and Y. Massoud, "Theory and implementation of an analog-to-information conversion using random demodulation," in *Proc. IEEE Int. Symposium on Circuits and Systems (ISCAS)*, New Orleans, La., May 2007, to appear and S. Kirolos, J. Laska, M. Wakin, M. Duarte, D. Baron, T. Ragheb, Y. Massoud, and R. Baraniuk, "Analog-to-information conversion via random demodulation," in *In Proc. IEEE Dallas Circuits and Systems Workshop (DCAS)*, 2006), an architecture based on a wideband pseudorandom modulator and a low-rate sampler, random sampling (see A. C. Gilbert, S. Muthukrishnan, and M. J. Strauss, "Improved time bounds for near-optimal sparse Fourier representations," in *Proc. Wavelets XI at SPIE Optics and Photonics*, San Diego, Calif., August 2005), an architecture based on pseudo-random non-uniform time samples, and coset sampling (see R. Shenoy, "Nonuniform sampling of signals and applications," *Circuits and Systems, 1994. ISCAS '94., 1994 IEEE International Symposium on*, vol. 2, pp. 181-184 vol. 2, May-2 Jun. 1994). Both of these systems can efficiently acquire a large class of compressible signals. Additionally, we discuss sampling from zero-crossings which can result in very low cost and low power acquisition systems, and recovery from samples that are quantized to 1-bit.

Analog Signal Model for CS

CS theory is framed in terms of discrete vectors and dictionaries, but the concepts can also be extended to continuous-time signals. One possible model is that of an analog signal x(t) that is a periodic or a finite-length signal which can be represented by its Fourier series. When the signal is also bandlimited, its samples at the Nyquist rate suffice to represent it. Under these assumptions, the discrete Fourier transform (DFT) coefficients of the regular samples of the signal are the same as the Fourier series coefficients. We refer to such signals as Fourier-sparse or Fourier-compressible if the vector of DFT coefficients is sparse or compressible, respectively. Thus, we can assume and operate on a discretized signal, x, which consists of samples of x(t) at or faster than the Nyquist rate. While this model is used in the systems introduced in this document, similar models may be applied for other acquisition systems.

Random Demodulator

The architecture of the random demodulator is depicted in FIG. 2. The analog input x(t) is mixed with a pseudo-random square pulse of ±1s, called the chipping sequence $p_c(t)$, which alternates between values at or faster than the Nyquist rate $N_\alpha$ Hz of the input signal. The mixed signal is integrated over a time period $1/M_\alpha$ and sampled by the back-end ADC at $M_\alpha$ Hz $<<N_\alpha$ Hz. In practice, data is processed in time blocks of period T, and we define $N=N_\alpha T$ as number of elements in the chipping sequence, and $M=M_\alpha T$ as number of measurements. In terms of the discretized model, this is equivalent to multiplying the signal x with a random sequence of ±1s and then summing every N/M sequential coefficients. The key observation, is that the modulator and chipping sequence operate at a fast rate, while the back-end ADC operates at a low rate. In hardware it is easier to build a high-rate modulator/chipping sequence combination than a high-rate ADC. In fact, many systems already use components of this front end for binary phase shift keying demodulation, as well as for other conventional communication schemes such as CDMA.

In our simulations with real data, it is possible to sample bandwidths of 6 MHz using 1/10 of the Nyquist rate and recover the signal with blocks as small as N=256. This system can be represented by a banded matrix Φ containing N/M pseudo-random ±1s per row, which operates on x. For example, with N=9 and M=3, such a Φ is expressed as $$\Phi = \begin{bmatrix} -1 & 1 & -1 & & & & & & \\ & & & -1 & -1 & 1 & & & \\ & & & & & & 1 & 1 & -1 \end{bmatrix}.$$

There are many ways to design a practical random demodulator system. For instance, the integrate and dump feature can be replaced by any number of analog or digital filters, the chipping sequence can be chosen to have values other than ±1, and the ADC can be non-uniform.

Random Sampling

One of the fundamental requirements in CS is that signals which are sparse in dictionary Ψ should be sampled with projections onto a set of functions Φ that are incoherent with Ψ. It is well known that the Fourier basis is maximally incoherent with the canonical basis; this has been applied to CS time-sparse signals from random subsets of its Fourier coefficients (see E. J. Candès, J. Romberg, and T. Tao, "Robust uncertainty principles: Exact signal reconstruction from highly incomplete frequency information," *IEEE Trans. Info. Theory*, vol. 52, no. 2, pp. 489-509, February 2006). Equivalently, random subsets of the identity matrix, i.e., non-uniform random time samples, provide enough information to recover Fourier-sparse signals using CS. For example, with N=9 and M=3, one such resulting matrix Φ is $$\Phi = \begin{bmatrix} 1 & 0 & 0 & 0 & 0 & 0 & 0 & 0 & 0 \\ 0 & 0 & 0 & 1 & 0 & 0 & 0 & 0 & 0 \\ 0 & 0 & 0 & 0 & 0 & 1 & 0 & 0 & 0 \end{bmatrix}.$$

Such a system can be implemented in several ways. One implementation may include a high-rate Nyquist sampler that does not transmit or store all of the samples. Alternatively, random sampling can be implemented as a bank of parallel low-rate samplers potentially at different rates and out of phase with each other.

Non-uniform pseudo-random sampling has been studied in other contexts outside of the CS framework. For example, there exist specialized fast algorithms for recovery of extremely large Fourier-sparse signals. The algorithm uses samples obtained from a structured non-uniform scheme based on random seeds, and it provides guarantees similar to those available from standard CS (see A. C. Gilbert, S. Muthukrishnan, and M. J. Strauss, "Improved time bounds for near-optimal sparse Fourier representations," in *Proc. Wavelets XI at SPIE Optics and Photonics*, San Diego, Calif., August 2005).

The Democracy of Compressive Sensing

Among the advantages of random measurements is a property commonly referred to as democracy. While it is not usually rigorously defined in the literature, democracy is usually taken to mean that each measurement contributes a similar amount of information about the signal x to the compressed representation y (see A. R. Calderbank and I. Daubechies, "The pros and cons of democracy," in *IEEE Trans. Inform. Theory*, vol. 48, no. 6, pp. 1721-1725, June 2002., S. Güntürk, "Harmonic analysis of two problems in signalcompression," Ph.D. dissertation, Program in Applied and Computation Mathematics, Princeton University, Princeton, N.J., September 2000., and E. Candès, "Integration of sensing and processing," *IMA annual program year workshop*, December 2005). Others have described democracy to mean that each measurement is equally important (or unimportant) (see J. Romberg and M. Wakin, "Compressed sensing: A tutorial," *IEEE Stat. Signal Proc. Workshop*, August 2007. Despite the fact that democracy is so frequently touted as an advantage of random measurements, it has received little analytical attention in the CS context. Perhaps more surprisingly, the property has not been explicitly exploited in applications until recently (see J. N. Laska, P. Boufounos, M.

A. Davenport, and R. G. Baraniuk, "Democracy in action: Quantization, saturation, and compressive sensing," *Preprint,* 2009.).

The fact that random measurements are democratic seems intuitive; when using random measurements, each measurement is a randomly weighted sum of a large fraction (or all) of the entries of x, and since the weights are chosen independently at random, no preference is given to any particular entries. More concretely, suppose that the measurements $y_1$, $y_2, \ldots, y_M$ are independent and identically distributed (i.i.d.) according to some distribution $f_y$, as is the case for the $\Phi$ considered in this report. Now suppose that we select $\tilde{M}<M$ of the $y_i$ at random (or according to some procedure that is independent of y). Then clearly, we are left with a length-$\tilde{M}$ measurement vector $\tilde{y}$ such that each $\tilde{y}_i \sim f_y$. Stated another way, if we set $D=M-\tilde{M}$, then there is no difference between collecting $\tilde{M}$ measurements and collecting M measurements and deleting D of them, provided that this deletion is done independently of the actual values of y.

However, following this line of reasoning will ultimately lead to a rather weak definition of democracy. To see this, consider the case where the measurements are deleted by an adversary. By adaptively deleting the entries of y one can change the distribution of $\tilde{y}$. For example, the adversary can delete the D largest elements of y, thereby skewing the distribution of $\tilde{y}$. In many cases, especially if the same matrix $\Phi$ will be used repeatedly with different measurements being deleted each time, it would be far better to know that any $\tilde{M}$ measurements will be sufficient to reconstruct the signal. This is a significantly stronger requirement.

In order to formally define this stronger notion of democracy, we must first describe the properties that a matrix must satisfy to ensure stable reconstruction. Towards that end, we recall the definition of the restricted isometry property (RIP) for the matrix $\Phi$ (see E. J. Candès and T. Tao, "Decoding by linear programming," *IEEE Trans. Inform. Theory*, vol. 51, pp. 4203-4215, December 2005).

Definition 1. A matrix $\Phi$ satisfies the RIP of order K with constant $\delta \in (0, 1)$ if $$(1-\delta)\|x\|_2^2 \leq \|\Phi x\|_2^2 \leq (1+\delta)\|x\|_2^2 \qquad (17)$$

holds for all x such that $\|x\|_0 \leq K$.

Much is known about matrices that satisfy the RIP, but for our purposes it suffices to note that if we draw a random M×N matrix $\Phi$ whose entries $\phi_{ij}$ are i.i.d. sub-Gaussian random variables, then provided that $$M = O(K \log(N/K)), \qquad (18)$$

we have that with high probability $\Phi$ will satisfy the RIP of order K with constant $\delta$ (see R. G. Baraniuk, M. A. Davenport, R. DeVore, and M. B. Wakin, "A simple proof of the restricted isometry property for random matrices," *Constructive Approximation*, vol. 28, no. 3, pp. 253-263, December 2008, and R. DeVore, G. Petrova, and P. Wojtaszczyk, "Instance-optimality in probability with an $l_1$-minimization decoder," *Appl. Comput. Harmon. Anal.*, vol. 27, no. 3, pp. 275-288, 2009.).

When it is satisfied, the RIP for a matrix $\Phi$ provides a sufficient condition to guarantee successful sparse recovery using a wide variety of algorithms (see E. J. Candès and T. Tao, "Decoding by linear programming," *IEEE Trans. Inform. Theory*, vol. 51, pp. 4203-4215, December 2005, E. J. Candès, "The restricted isometry property and its implications for compressed sensing," in *Compte Rendus de l'Academie des Sciences, Paris, Series I*, 2008, vol. 346, pp. 589-592, T. Cai, X. Guangwu, and J. Zhang, "On recovery of sparse signals via $l_1$ minimization," *IEEE Trans. Inform. Theory*, vol. 55, no. 7, pp. 3388-3397, 2009., M. Davenport and M. Wakin, "Analysis of Orthogonal Matching Pursuit using the restricted isometry property," *Preprint*, 2009., D. Needell and R. Vershynin, "Uniform uncertainty principle and signal recovery via regularized orthogonal matching pursuit," *Found. Comput. Math.*, vol. 9, no. 3, pp. 317-334, 2009, "Signal recovery from incomplete and inaccurate measurements via regularized orthogonal matching pursuit," 2007, to appear in IEEE J. Selected Topics in Signal Processing., D. Needell and J. A. Tropp, "Cosamp: Iterative signal recovery from incomplete and inaccurate samples," *Accepted to Appl. Comp. Harmonic Anal.*, 2008, W. Dai and O. Milenkovic, "Subspace pursuit for compressive sensing signal reconstruction," *IEEE Trans. Inform. Theory*, vol. 55, no. 5, pp. 2230-2249, 2009., A. Cohen, W. Dahmen, and R. DeVore, "Instance optimal decoding by thresholding in compressed sensing," 2008, preprint., T. Blumensath and M. E. Davies, "Iterative hard thresholding for compressive sensing," *Appl. Comp. Harmonic Anal.*, vol. 27, no. 3, pp. 265-274, November 2009., R. Chartrand and V. Staneva, "Restricted isometry properties and nonconvex compressive sensing," *Inverse Problems*, vol. 24, no. 035020, pp. 1-14, 2008.). As an example, the RIP of order 2K (with isometry constant $\delta < \sqrt{2}-1$) is a sufficient condition to permit $l_1$-minimization (the canonical convex optimization problem for sparse approximation) to exactly recover any K-sparse signal and to approximately recover those that are nearly sparse (see E. J. Candès, "The restricted isometry property and its implications for compressed sensing," in *Compte Rendus de l'Academie des Sciences, Paris, Series I*, 2008, vol. 346, pp. 589-592). The same assumption is also a sufficient condition for robust recovery in noise using a modified $l_1$-minimization (see E. J. Candès, "The restricted isometry property and its implications for compressed sensing," in *Compte Rendus de l'Academie des Sciences, Paris, Series I*, 2008, vol. 346, pp. 589-592).

The RIP also provides us with a way to quantify our notion of democracy. To do so, we first establish some notation that will prove useful throughout this report. Let $\Gamma \subset \{1, 2, \ldots, M\}$. By $\Phi^\Gamma$ we mean the $|\Gamma| \times M$ matrix obtained by selecting the rows of $\Phi$ indexed by $\Gamma$. Alternatively, if $\Lambda \subset \{1, 2, \ldots, N\}$, then we use $\Phi_\Lambda$ to indicate the M×$|\Lambda|$ matrix obtained by selecting the columns of $\Phi$ indexed by $\Lambda$. Following (see J. N. Laska, P. Boufounos, M. A. Davenport, and R. G. Baraniuk, "Democracy in action: Quantization, saturation, and compressive sensing," *Preprint*, 2009.), we now formally define democracy as follows.

Definition 2. Let $\Phi$ be and M×N matrix, and let $\tilde{M} \leq M$ be given. We say that $\Phi$ is ($\tilde{M}$, K, $\delta$)-democratic if for all $\Gamma$ such that $|\Gamma| \geq \tilde{M}$ the matrix $\Phi^\Gamma$ satisfies the RIP of order K with constant $\delta$.

Theorem 2. Let $\Phi$ by an M×N matrix with elements $\Phi_{ij}$ drawn according to N(0,1/M) and let $\tilde{M} \leq M$, $K \leq \tilde{M}$, and $\delta \in (0, 1)$ be given. Define $D=M-\tilde{M}$. If $$M = C_1(K + D)\log\left(\frac{N + M}{K + D}\right), \qquad (19)$$

then with probability exceeding $1 - 3e^{-C_2 M}$ we have that $\Phi$ is ($\tilde{M}$, K, $\delta/(1-\delta)$)-democratic, where $C_1$ is arbitrary and $C_2 = (\delta/8)^2 - \log(42e/\delta)/C_1$.

Observe that we require roughly O(D log(N)) additional measurements to ensure that $\Phi$ is ($\tilde{M}$, K, $\delta$)-democratic compared to the number of measurements required to simply ensure that $\Phi$ satisfies the RIP of order K. This seems intuitive; if we wish to be robust to the loss of any D measurements while retaining the RIP of order K, then we should expect to take at least D additional measurements. This is not unique to the CS framework. For instance, by oversampling, i.e., sampling faster than the minimum required Nyquist rate, uniform sampling systems can also improve robustness with respect to the loss of measurements. Reconstruction can be performed in principle on the remaining non-uniform grid, as long as the remaining samples satisfy the Nyquist range on average.

However, linear reconstruction in such cases is known to be unstable. Furthermore the linear reconstruction kernels are difficult to compute. Under certain conditions stable non-linear reconstruction is possible, although this poses further requirements on the subset set of samples that can be lost and the computation can be expensive. For example, dropping contiguous groups of measurements can be a challenge for the stability of the reconstruction algorithms. Instead, the democratic principle of CS allows dropping of an arbitrary subset D of the measurements without compromising the reconstruction stability, independent of the way these measurements are chosen.

In some applications, this difference may have significant impact. For example, in finite dynamic range quantizers, the measurements saturate when their magnitude exceeds some level. Thus, when uniformly sampling with a low saturation level, if one sample saturates, then the likelihood that any of the neighboring samples will saturate is high, and significant oversampling may be required to ensure any benefit. However, in CS, if many adjacent measurements were to saturate, then for only a slight increase in the number of measurements we can mitigate this kind of error by simply rejecting the saturated measurements; the fact that $\Phi$ is democratic ensures that this strategy will be effective.

Theorem 2 further guarantees graceful degradation due to loss of samples. Specifically, the theorem implies that reconstruction from any subset of CS measurements is stable to the loss of a potentially larger number of measurements than anticipated. To see this, suppose that and M×N matrix $\Phi$ is (M−D, K,$\delta$)-democratic, but consider the situation where D+$\tilde{D}$ measurements are dropped. It is clear from the proof of Theorem 2 that if $\tilde{D}$<K, then the resulting matrix $\Phi^\Gamma$ will satisfy the RIP of order K−$\tilde{D}$ with constant $\delta$. Thus, from E. Candès, J. K. Romberg, and T. Tao, "Stable signal recovery from incomplete and inaccurate measurements," Comm. Pure and Appl. Math., vol. 59, no. 8, pp. 1207-1223, 2006., if we define $\tilde{K}$=(K−$\tilde{D}$)/2, then the reconstruction error is then bounded by $$\|x - \hat{x}\|_2 \le C_3 \frac{\|x - x_{\tilde{K}}\|_1}{\sqrt{\tilde{K}}}, \quad (20)$$

where $x_{\tilde{K}}$ denotes the best $\tilde{K}$-term approximation of x and $C_3$ is an absolute constant depending on $\Phi$ that can be bounded using the constants derived in Theorem 2. Thus, if $\tilde{D}$ is small then the additional error caused by dropping too many measurements will also be relatively small. To our knowledge, there is simply no analog to this kind of graceful degradation result for uniform sampling with linear reconstruction. When the number of dropped samples exceeds D, there is are no guarantees as to the accuracy of the reconstruction.

SUMMARY OF THE INVENTION

The present invention is a new method and apparatus for tracking and estimating parameters of locally oscillating signals from measurements that approximately preserve the inner product among signals in a class of signals of interest. Standard uniform sampling measurements are a classic example when gathered at the Nyquist rate. However, there is a far more general class of measurement schemes that offer advantages over standard Nyquist sampling. Random demodulation, random sampling, and coset sampling are three prime examples of these techniques.

Locally oscillating signals are sparse or compressible in a basis such as Fourier. The compressed sensing community and others have introduced the notion of the restricted isometry property. This property offers a way of justifying whether a sampling scheme will sufficiently preserve the inner product among signals within the class. However the present measurement schemes are not limited to those justified by this framework but offer it solely as an exemplary embodiment.

The primary application area for the examples was a compressive phase locked loops (PLL), which has a wide variety of applications, including but not limited to communications, phase tracking, robust control, sensing, and frequency modulation (FM) demodulation.

Below we present two novel designs and preferred embodiments:
CS-PLL: This design modifies classical PLL designs to operate with CS-based sampling systems. By introducing a compressive sampler at the output of the oscillator and by appropriately adjusting the phase difference estimator we enable the use of PLLs with modern CS sampling technology.
QCS-PLL: This design modifies the CS-PLL feedback loop by introducing a second oscillator, 90° out of phase with the first one and by intelligently adapting the phase difference estimator to take both oscillators into account.

The concept of democracy is also introduced into a CS-PLL with quantization effects, a concept recently introduced into the compressive sensing community. Due to the universality of compressive measurements, we can drop a few saturated measurements, yet still maintain performance (dropping too many would be problematic however).

The CS-PLL and QCS-PLL enable one to track oscillating signals in very large bandwidths using a small number of measurements. In addition to potentially operating below the Nyquist rate, however, our new PLL designs offer very low computational complexity that does not involve intermediate compressive sensing signal reconstruction. The traditional methods of greedy algorithms or $l_1$ minimization may require many iterations and arithmetic operations, and to date operate on fixed length signals. One the other hand, the CS-PLL operates on a permeasurement basis, offering much more immediate feedback to other systems relying on the output signal.

In a preferred embodiment, the present invention is a method for estimating and tracking locally oscillating signals. The method comprises the steps of taking measurements of an analog or digital input signal that approximately preserve the inner products among signals in a class of signals of interest and computing an estimate of parameters of the input signal from its inner products with other signals. The step of taking measurements may be linear and approximately preserve inner products, or may be non-linear and approximately preserves inner products. Further, the step of taking measurements is nonadaptive. And may comprise compressive sensing. In turn, the compressive sensing may comprise projection using one of a random matrix, a pseudorandom matrix, a sparse matrix and a code matrix. The step of tracking said signal of interest with a phase-locked loop may comprise, for example, operating on compressively sampled data or by operating on compressively sampled frequency modulated data, tracking phase and frequency. The step of taking measurements may comprise taking measurements using one of a random demodulator, a random sampler, or another compressive sensing sensor. The step of computing an estimate may comprise estimating the parameters with a feedback loop. The signals of interest, for example may be locally periodic signals with time-varying fundamental frequency and/or phase or sinusoids with time varying frequency and/or phase. The step of computing an estimate of the parameters may comprise estimating the phase and/or frequency with a single feedback loop. The single feedback loop may operate in real-time.

In another embodiment, the present invention is a method for estimating and tracking locally oscillating signals. The method comprises the steps of taking measurements of an analog or digital input signal that is a stable embedding between a class of signals of interest and computing an estimate of parameters of the input signal from its inner products with other signals. The step of taking measurements may comprise a linear measurement technique and said linear measurement technique is a stable embedding between a class of signals of interest. The linear measurement technique may be nonadaptive.

In another embodiment, the present invention is a system for estimating and tracking locally oscillating signals. The system comprises means for taking measurements of an analog or digital input signal that approximately preserve inner products among signals in a class of signals of interest and means for computing an estimate of parameters of the input signal from its inner products with other signals.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

Figure 5A:
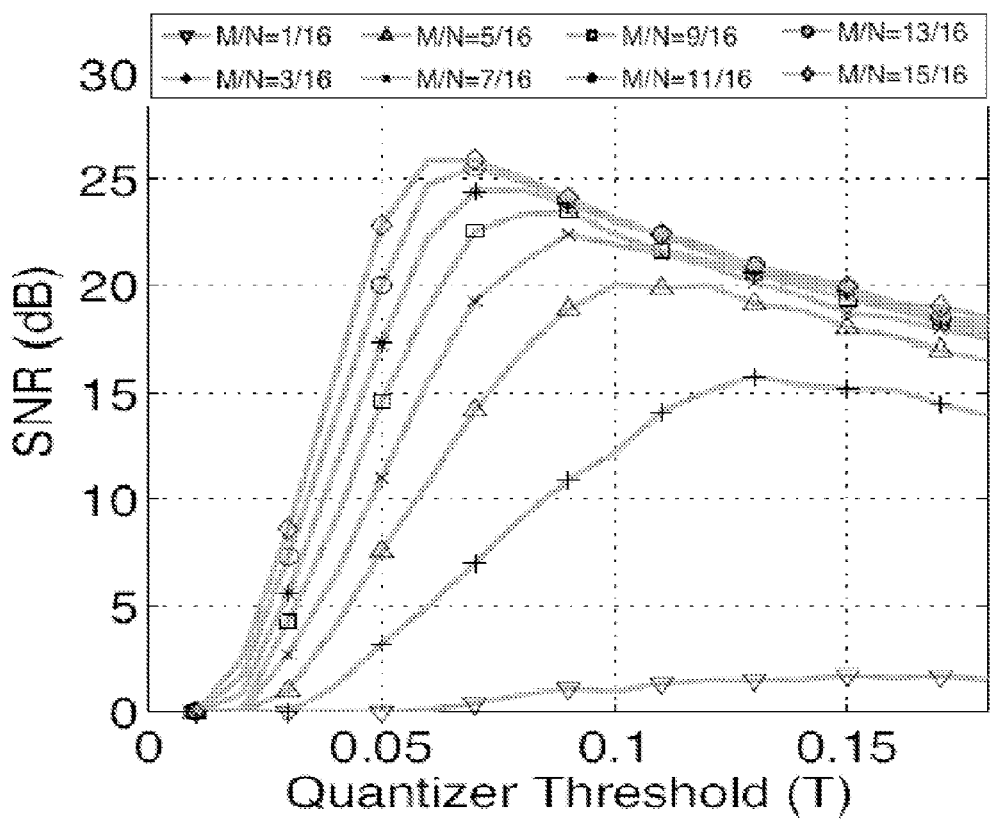
FIGS. 5A through 5C show the reconstruction SNR (dB) vs. quantizer saturation thresh (T) using a 4-bit quantizer and downsampling rate $$\frac{M}{N} = \frac{1}{16} \ldots \frac{13}{16}$$
Figure 5B:
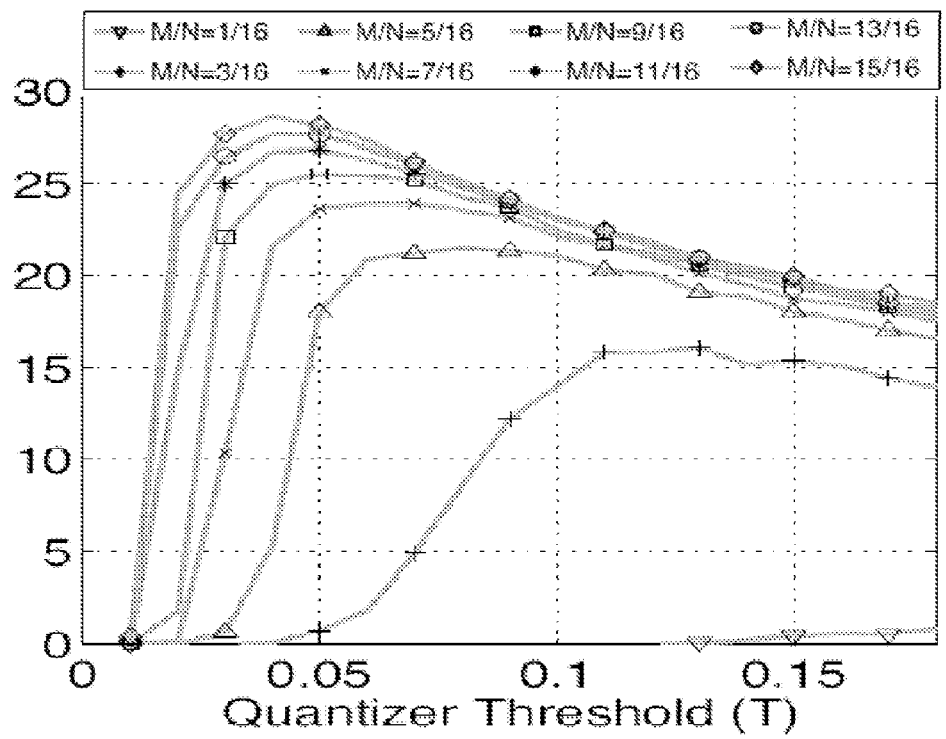

if the saturated measurements are used for reconstruction (FIG. 5A), the saturated measurements are discarded before reconstruction (FIG. 5B) and a side-by side comparison of 5A and 5B for $$\frac{M}{N} = \frac{1}{16} \text{ and } \frac{13}{16}$$

Figure 5C:
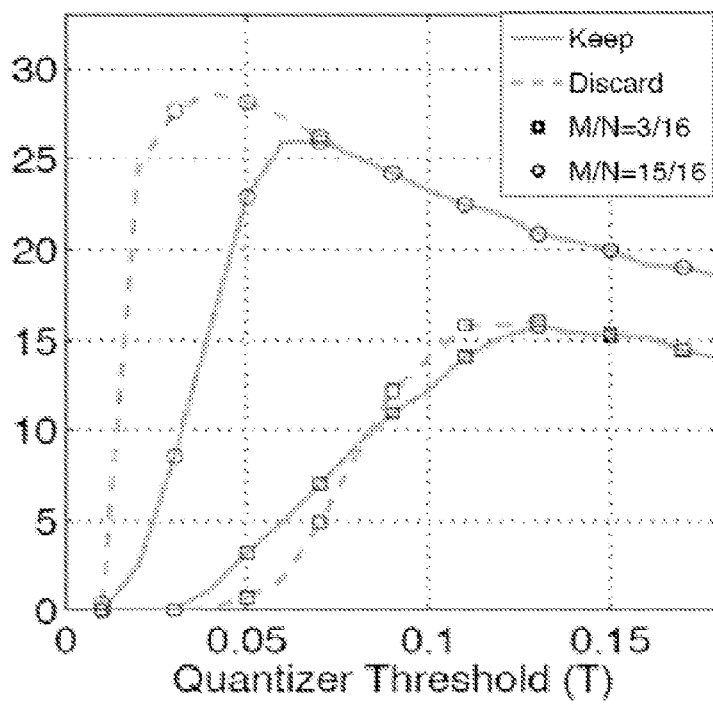

(FIG. 5C): by lowering the threshold T and rejecting saturated measurements, one achieves the highest reconstruction SNR.

Figure 6:
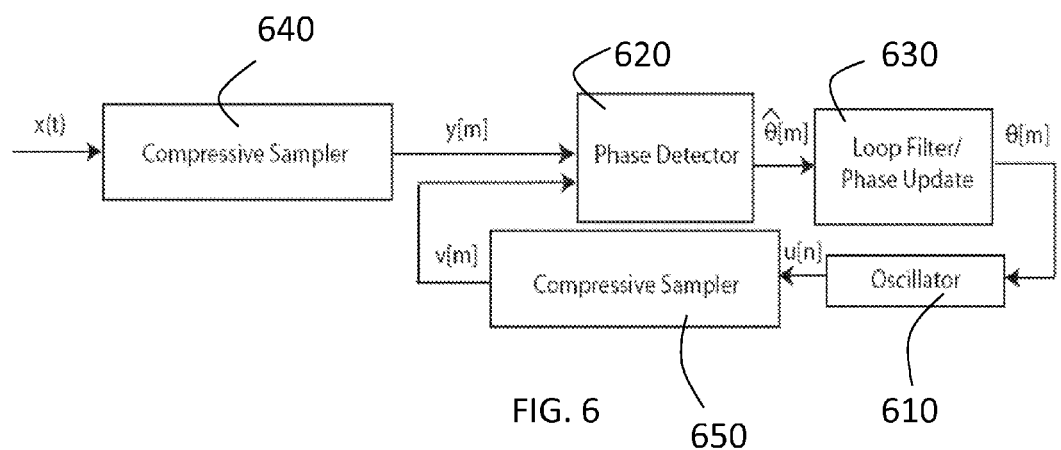

FIG. 6 is the block diagram of a compressive phase locked loop (CS-PLL) in accordance with a preferred embodiment of the present invention.

Figure 7:
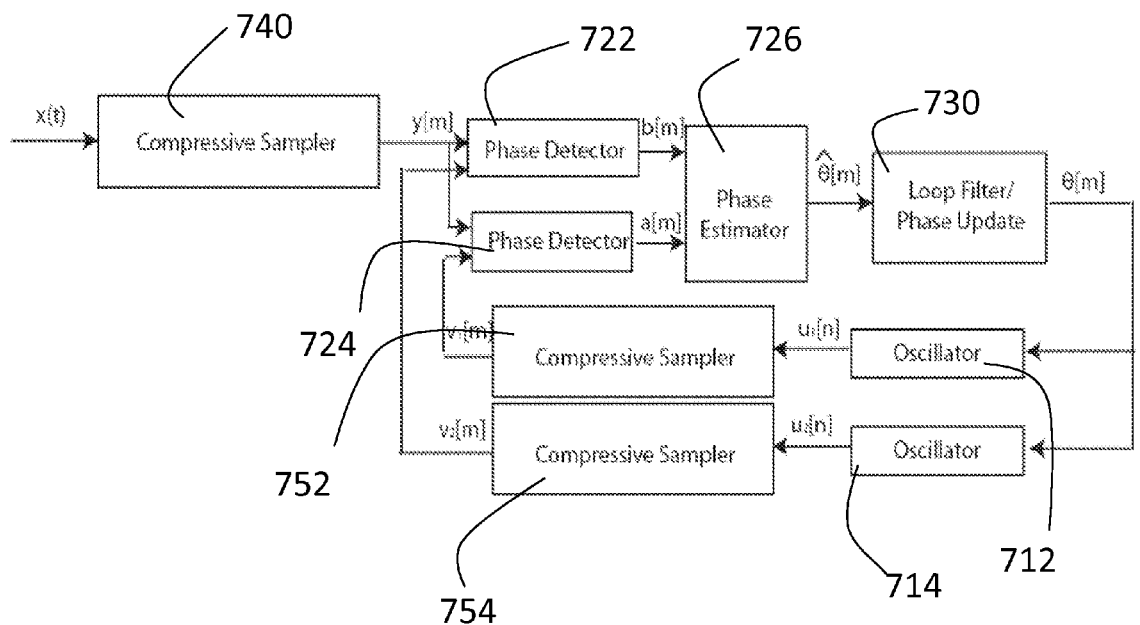

FIG. 7 is a block diagram of a quadrature compressive phase locked loop (QCS-PLL) design in accordance with a preferred embodiment of the present invention.

Figure 8:
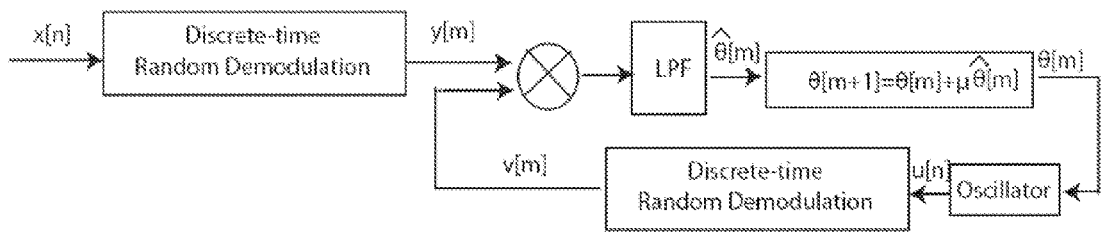

FIG. 8 is a block diagram of a compressive phase locked loop (CS-PLL) design used for testing phase lock in accordance with a preferred embodiment of the present invention.

Figure 9:
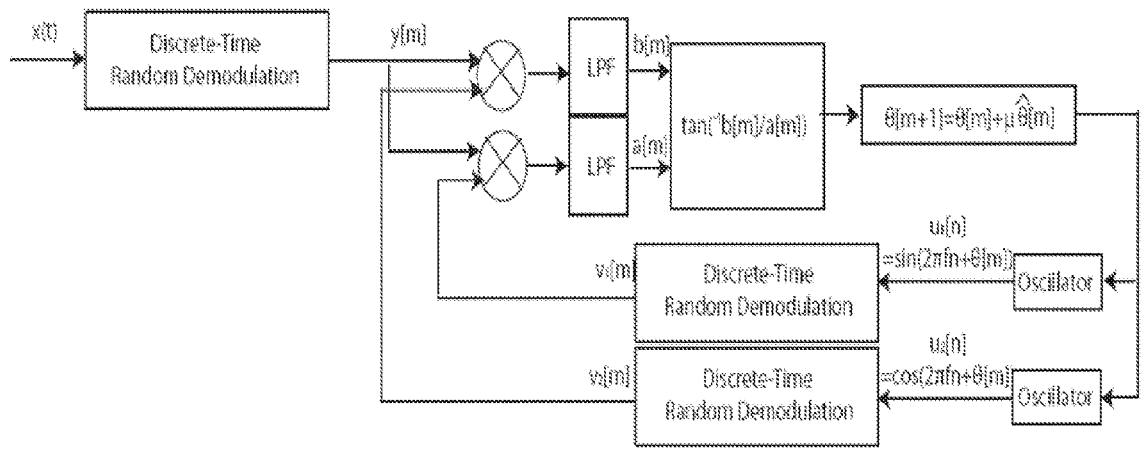

FIG. 9 is a block diagram of a quadrature compressive phase locked loop (QCS-PLL) design used for testing phase lock in accordance with a preferred embodiment of the present invention.

Figure 10A:
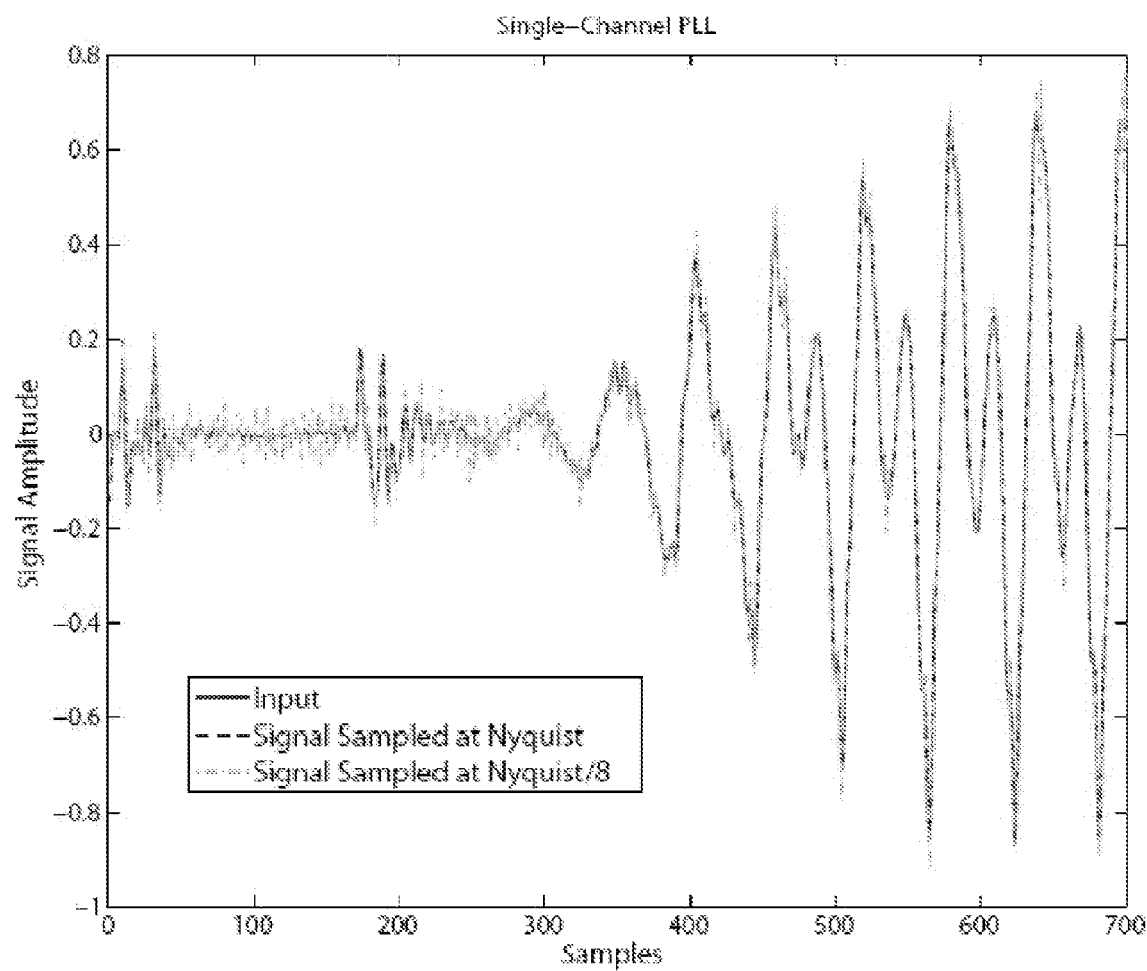
Figure 10B:
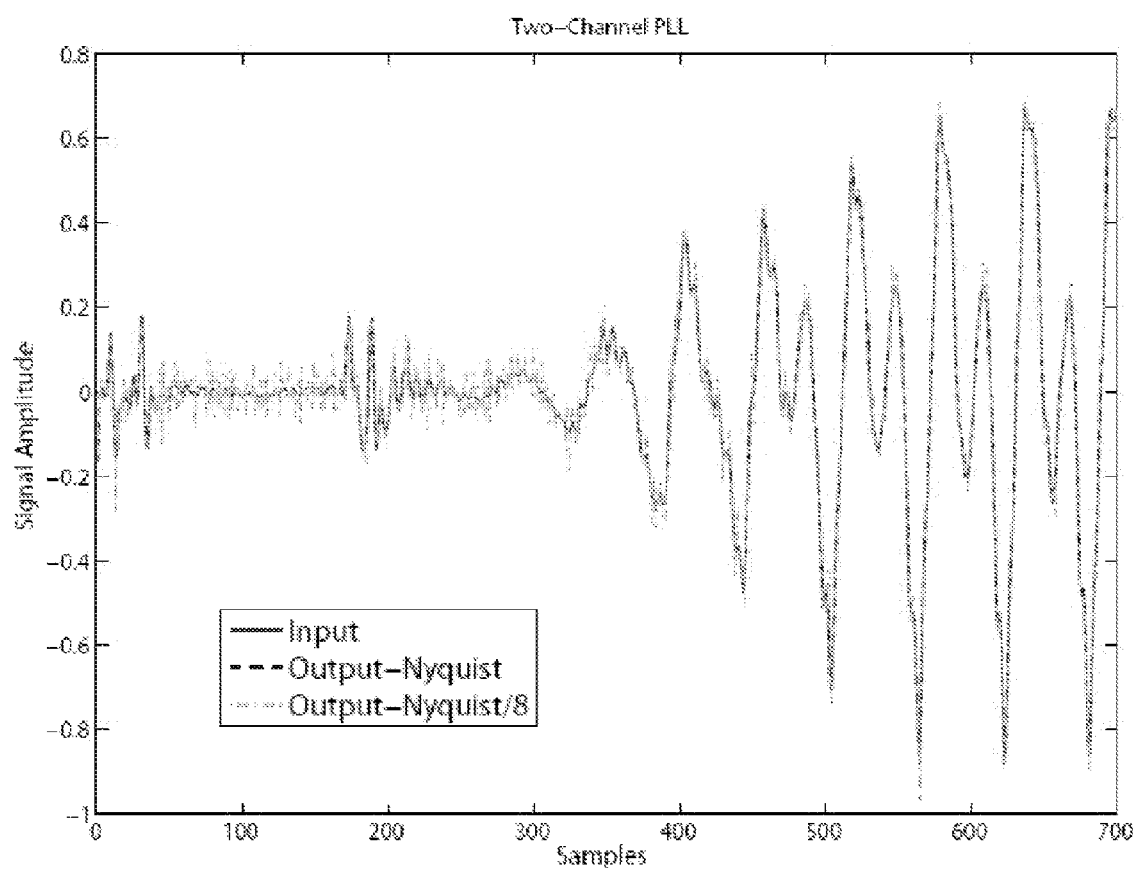

FIGS. 10A and 10B show an example embodiment of a system locking phase. In FIG. 10A the input is plotted against a single channel PLL and CS-PLL with one-eighth the original sampling rate. In FIG. 10B the input is plotted against a two channel PLL and QCS-PLL with one-eighth the original sampling rate. All PLLs do reasonably well at tracking the input, especially once the signal amplitude is stronger. The do well enough that they appear to overlap in the plot and it is difficult to distinguish among them.

Figure 11A:
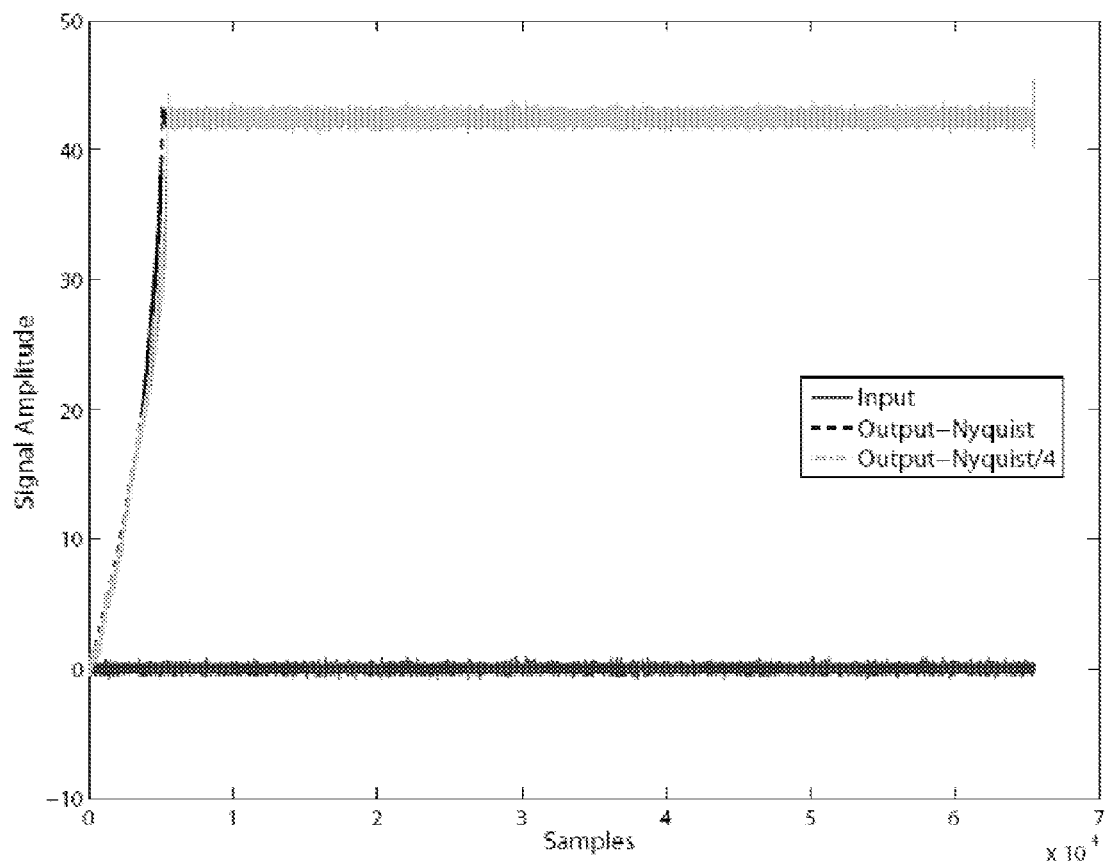
Figure 11B:
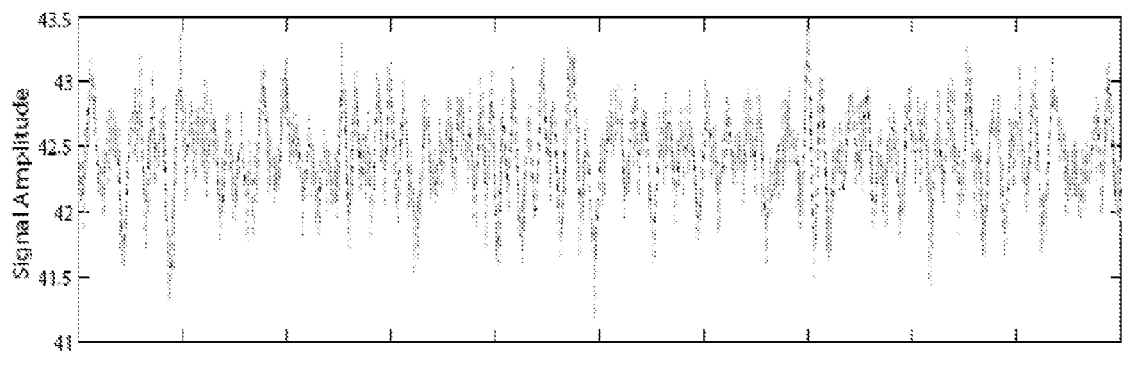
Figure 11C:
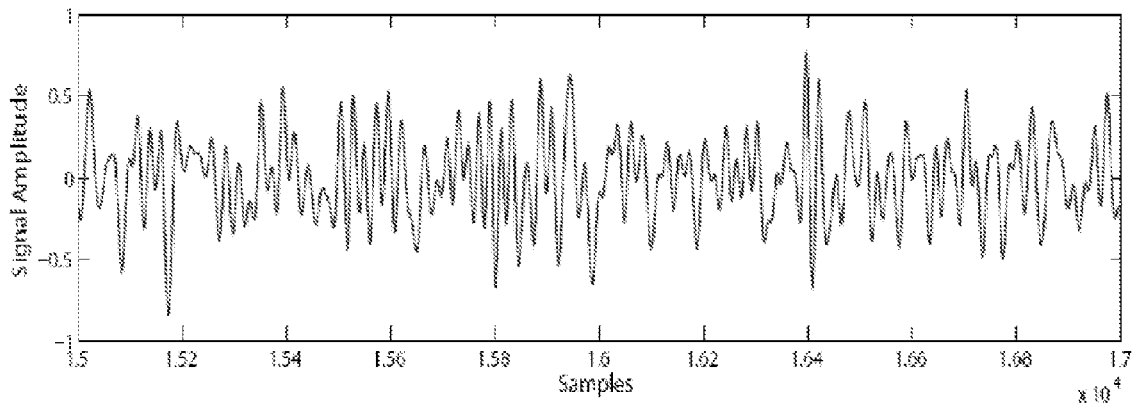

FIGS. 11A, 11B and 11C show the input and output when a random message signal and random FM center frequency are used as input to the CS-PLL and the oscillator frequency within the loop is set at 98% of the FM center frequency. In FIG. 11A both the traditional PLL and CS-PLL quickly converge (an offset is introduced because of the difference in FM center frequency and oscillator frequency), with the traditional PLL converging only slightly faster. In FIGS. 11B and 11C the message signal is preserved as shown by this zoomed in image. There is a slight delay in the outputs relative to the input.

Figure 12A:
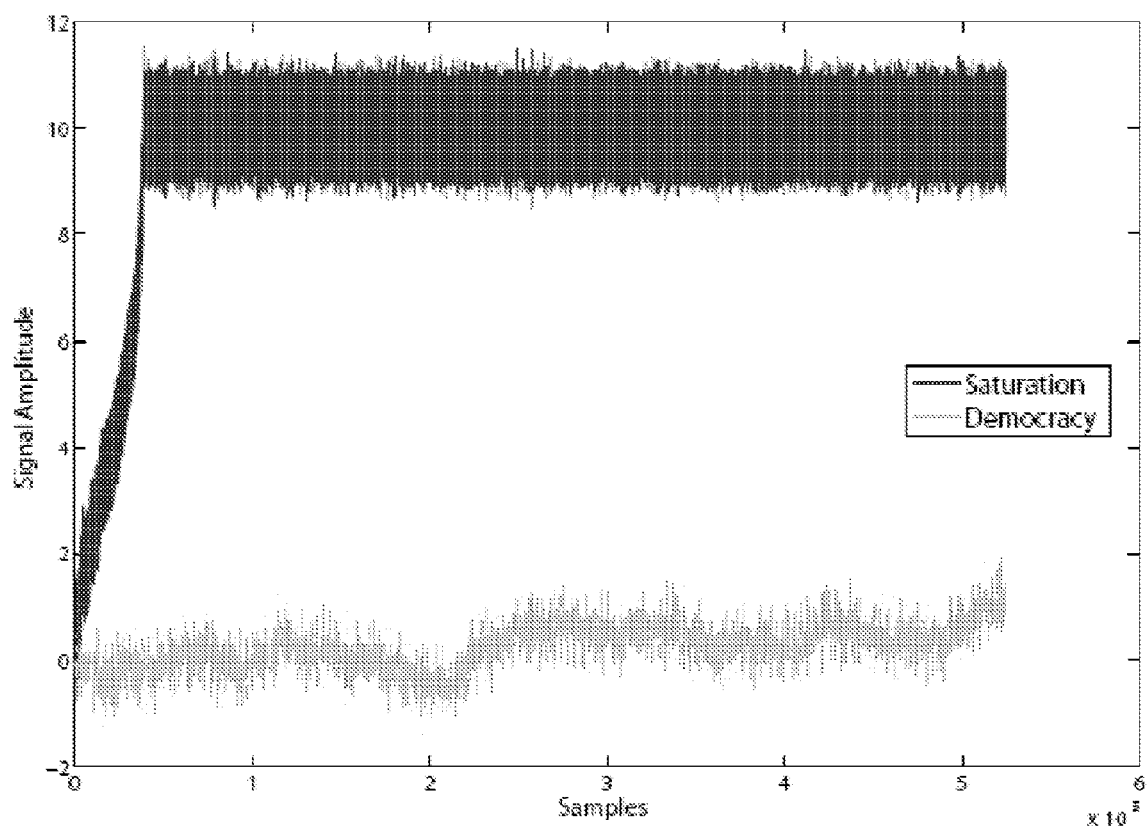
Figure 12B:
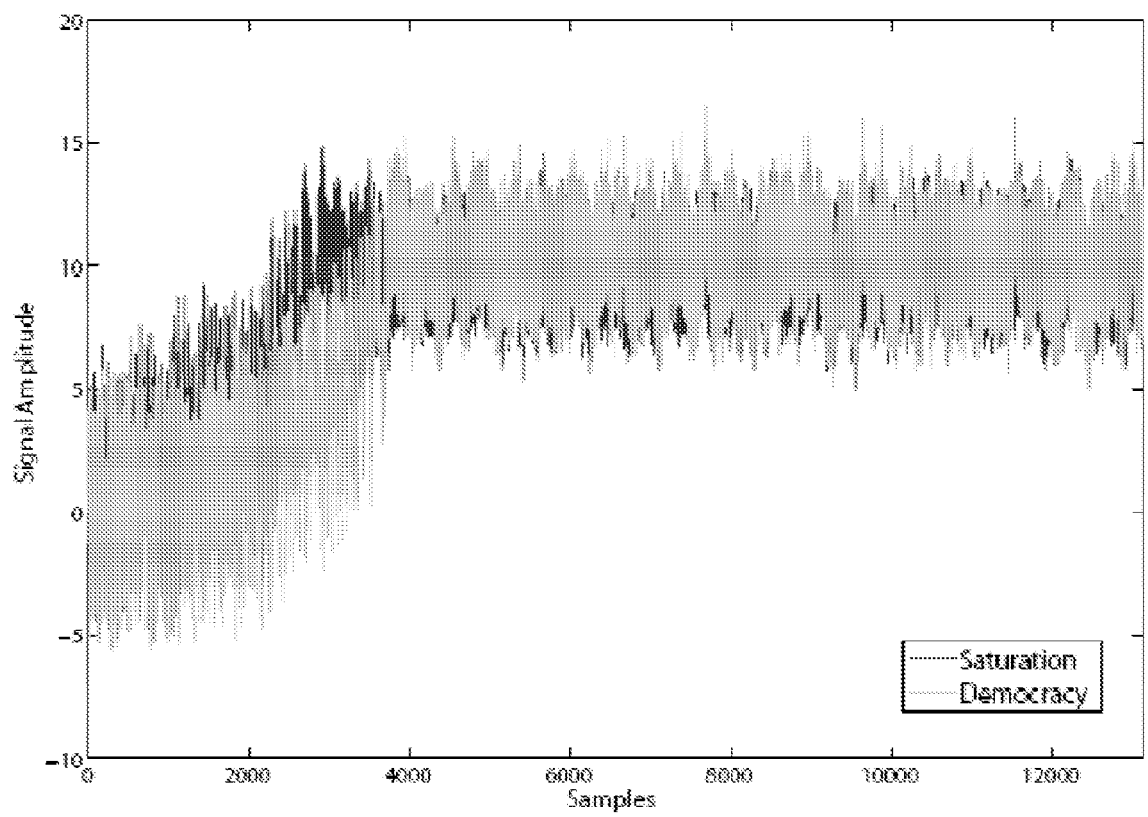
Figure 12C:
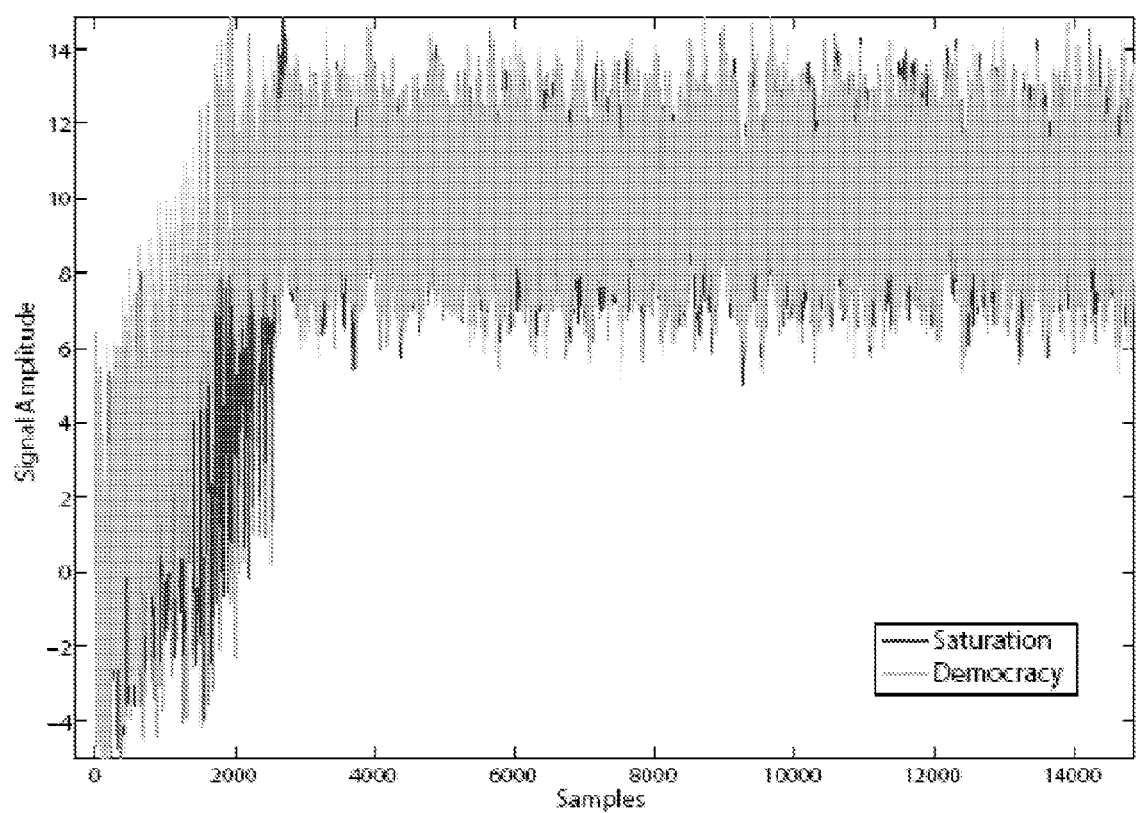

FIGS. 12A-12C demonstrate results for democracy when applied to the PLL for threshold level In FIG. 12A, T=0.2, and the democracy case loses too many measures and cannot converge. In FIG. 12B, T=1.40, and output when saturation is allowed converges slightly faster than applying democracy. In FIG. 12C, T=1.44, and applying democracy slightly increases the convergence rate. Here only a small number of measurements are dropped.

Figure 13:
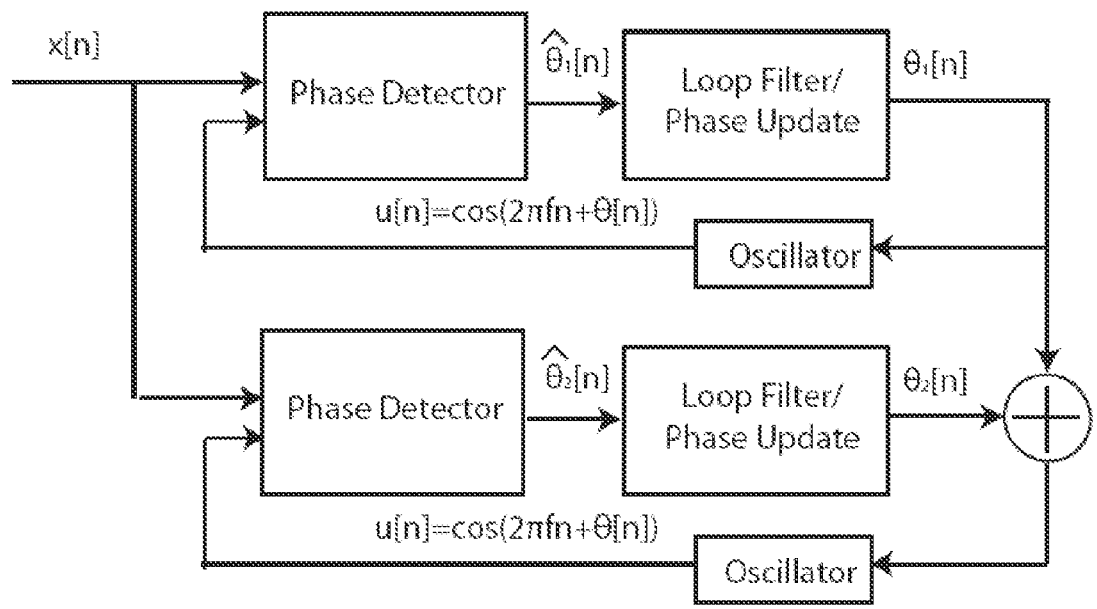

FIG. 13 shows a variation of the dual PLL presented in C. R. J. Jr and W. A. Sethares, *Telecommunication Breakdown*. Prentice Hall, 2004. This is one variation that can be easily modified to work with our CS architecture. We just add compressive samplers after each oscillator in the loop. Preservation of inner products would again apply to this system to explain its performance characteristics given enough measurements. The two low pass filters can, and likely will be different.

Figure 14:
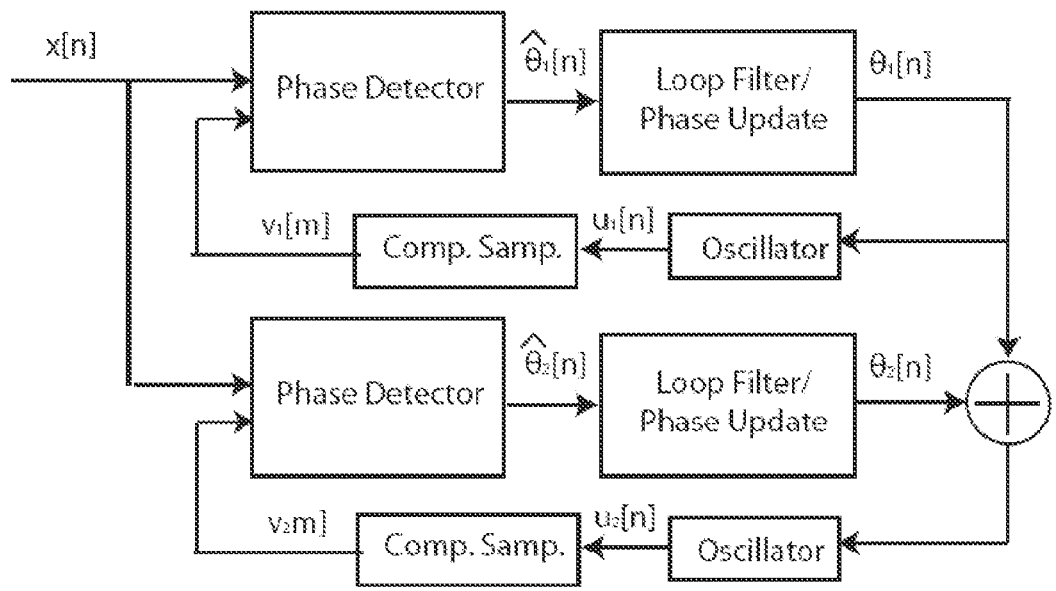

FIG. 14 shows the dual PLL presented in C. R. J. Jr and W. A. Sethares, *Telecommunication Breakdown*. Prentice Hall, 2004 modified to use CS measurements.

DETAILED DESCRIPTION OF THE PREFERRED EMBODIMENTS

Compressive Sensing PLL

Current digital and mixed analog/digital PLL designs in the literature operate under the assumption that the input signal is sampled uniformly at or above the Nyquist rate. However, as discussed in Section 1.3, in some applications the bandwidth of the signal of interest is so large that sampling at the Nyquist rate is prohibitive or impossible. However, some of these applications feature sparse or compressible signals that can be compressively sampled using CS techniques. Intuitively, a sinusoid whose frequency and phase we are interested in measuring and tracking could have a very high frequency but is (at least locally) sparse in the Fourier basis with K=1. Hence, such parameter estimation and tracking is a potential candidate for CS techniques.

Figure 1:
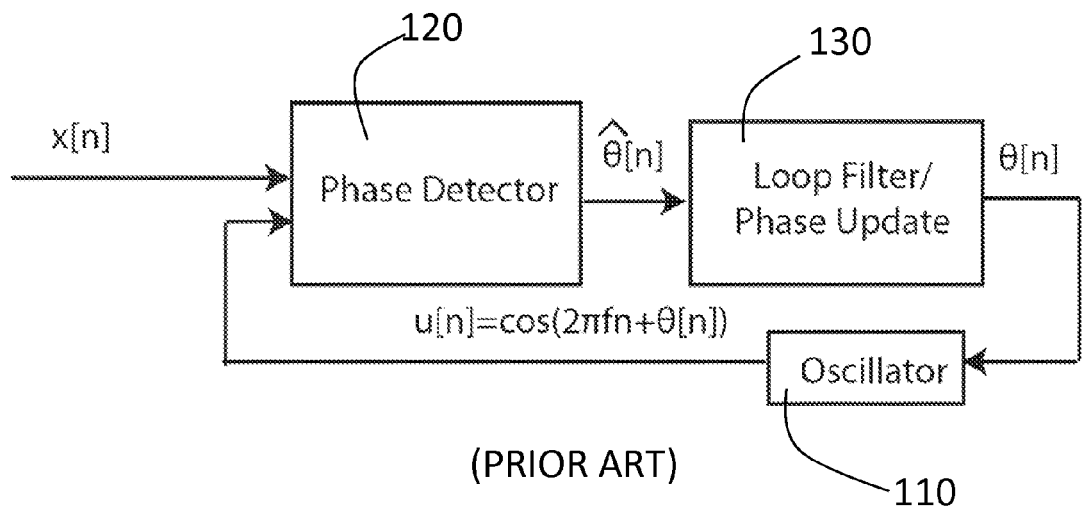
FIG. 1 is a block diagram of a basic prior art phase locked loop (PLL) design for discrete-time (digital) signals.

The present invention is a new family of digital and mixed analog/digital PLLs based on CS. Recall that the calculation used to update the phase estimate in the basic PLL of FIG. 1 is the (weighted) inner product between the Nyquist rate samples x[n] of the signal we wish to estimate/track and the estimated signal u[n] that is generated by the oscillator. If both x[n] and u[n] can be represented by not only their Nyquist rate samples but also their (lower rate) compressive samples using compressive samplers (with x[n] producing y[m] and u[n] producing v[m]), then the RIP of CS guarantees that the inner product between their compressive samples y[m] and v[m] will be very close to the same value as the inner product between their Nyquist rate samples x[n] and y[n] (see Eq. 10).

Therefore, we introduce into the basic PLL block diagram of FIG. 1 two compressive samplers 640, 650 as in FIG. 6, along with oscillator 610, phase detector 620, and loop filter 630. The first compressive sampler 640 acquires compressive samples y[m] of the analog or discrete-time input signal x(t). The second compressive sampler 650 converts the Nyquist rate samples u[n] of the estimated signal that is generated by the oscillator 610 into compressive samples v[m].

Figure 2:
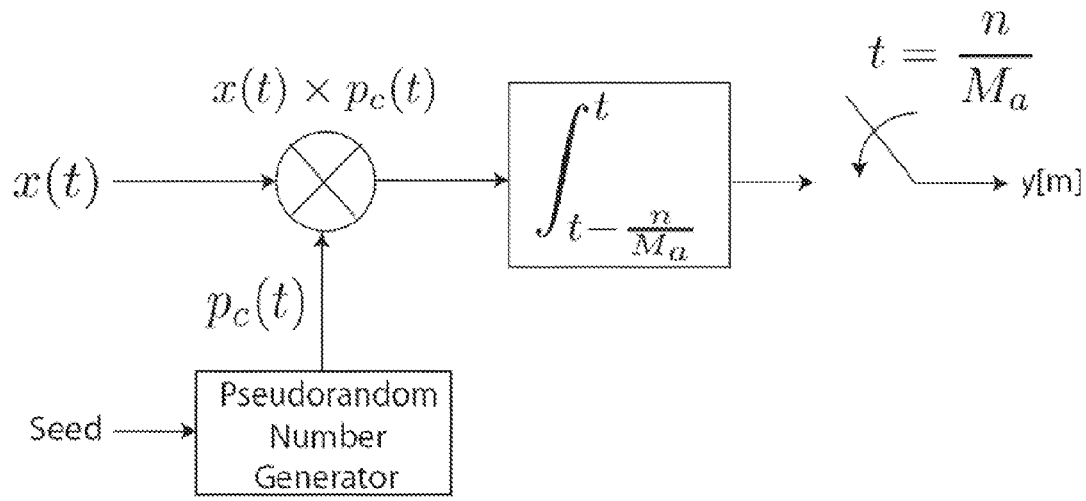
FIG. 2 is a block diagram of a random demodulator.
Figure 3:
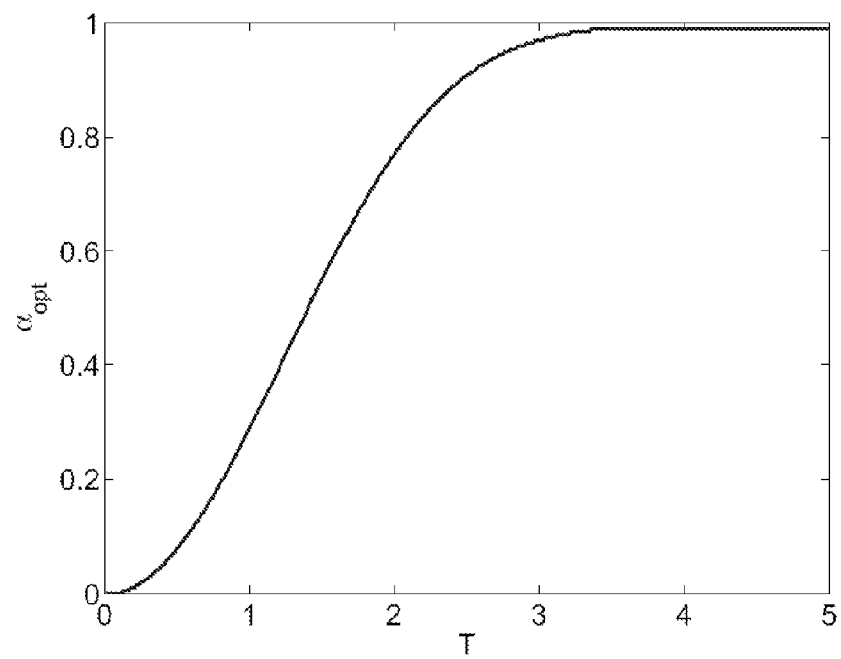
FIG. 3 is a graph illustrating the maximum possible a for a given threshold T.
Figure 4A:
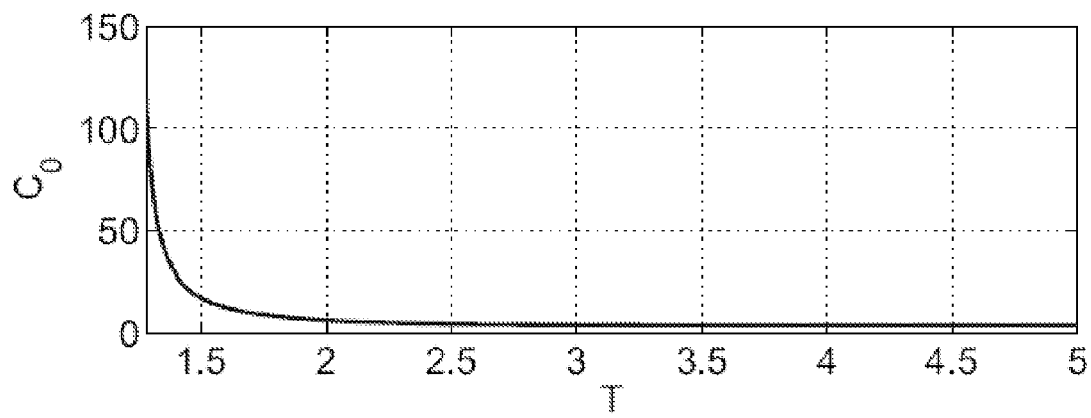
FIG. 4A is a graph of a reconstruction constant $C_0$ as a function of T.
Figure 4B:
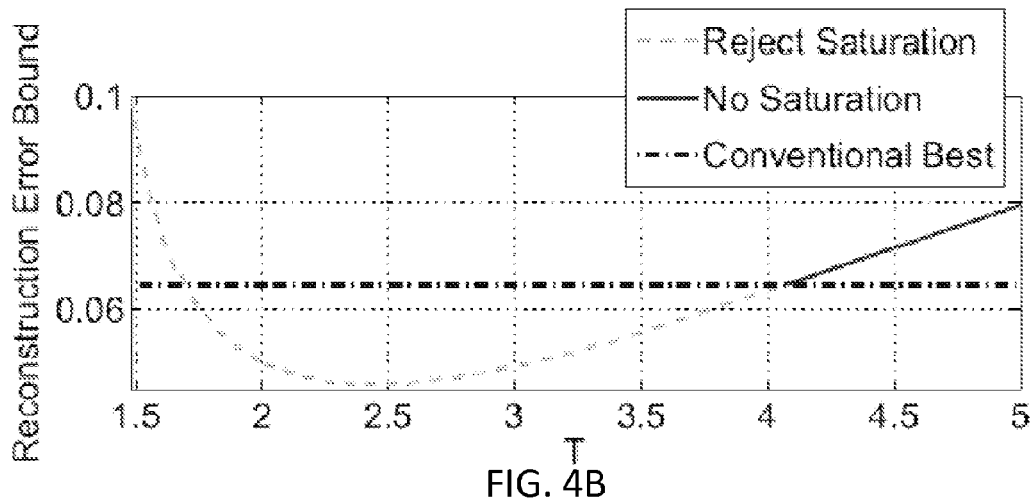
FIG. 4B is a graph of the upper bound on reconstruction error (normalized by M) as a function of quantizer threshold T. The dashed-line corresponds to bound obtained by rejecting saturated measurements. The solid line corresponds to bound obtained when no measurements saturate (with probability less than 0.00005). The dash-dotted line depicts the best reconstruction error for the conventional strategy, where no measurements clip. This plot demonstrates that reconstruction performance due to quantization can be improved by allowing the quantizer to saturate and rejecting saturated measurements.

In one possible embodiment of the invention, the two compressive samplers are synchronized to apply the same compressive sampling operation Φ to the signals x(t) and u[n]. In one embodiment, the compressive sampler Φ is the random demodulator shown in FIG. 2. Then to synchronize the two random demodulators, we input the same pseudorandom sequence p[n] to the two random demodulator multipliers; we use the same filter impulse response in the two integrators; and we synchronize the low-rate sampling in the two ADCs. In the case where x(t) is an analog signal and u[n] is a discrete-time signal, the oscillator within the loop should mimic the sampled impulse response of the analog to information converter. This may require some calibration, especially to limit the noise.

As with the classical PLL, the CS-PLL computes the inner product using a multiplier and a filter:

$$\hat{\theta}[m] = \sum_k y[k]v[k]h[m-k], \qquad (21)$$

where the filter impulse response h[m] acts as the kernel of the inner product. We may also use a non-linear and/or time varying filter. This filter is not necessarily the same as in the classical PLL, and the use of index m denotes a lower sampling rate than the Nyquist sampling counterpart. Specifically, the introduction of the compressive sampler component in the CS-PLL implies that the kernel of the inner product in the compressive domain should also be designed according to the sampler used. In the ideal design, the inner product in the compressive domain is as close to the correlation of the signals as possible, as described in Eq. (10). This would reduce the error of the CS-PLL, but is only one of many tradeoffs to consider; others are group delay, filter order, and model accuracy.

The resulting estimate is smoothed using an additional filter, the "loop" filter, and input into an oscillator. Both of these components, the filters and oscillator, are the same as those used in the classical PLL. However, due to the rate reduction in the CS-PLL, filters must be redesigned to operate properly at the lower rate. For example, in some embodiments, the memory parameter of the exponential moving average loop filter—μ in Eq. (5)—could be scaled by the sampling rate reduction factor. Despite these details, our invention differs from the PLL in the use of compressive measurements instead of linear samples.

In one possible embodiment of the invention, we will use a conventional oscillator to generate the signal u[n] at Nyquist rate and then compressively sample it to obtain v[m]. In another possible embodiment, we combine the oscillator and the subsequent compressive sampling into one single digital operation. This is primarily an implementation issue. In another embodiment, the oscillator can operate at in the digital domain, at the Nyquist rate, and be sampled by a digital domain compressive sampler. Furthermore—depending on the architecture of the compressive sampler—the oscillator and the compressive sampler can often be combined into one component, which produces the same output as the two components acting independently.

We call the system in FIG. 6 a compressive sensing phase locked loop (CS-PLL). In one embodiment, for signals that are amenable to CS techniques, the CS-PLL system can run at a sub-Nyquist sampling rate.

PLLs are designed to obtain the frequency and phase of the input signal after a reasonable number of iterations, and retain the frequency information as the signal progresses through time. For applications such as FM demodulation, the message signal actually turns out to be the error of the PLL when the correct frequency is maintained. For clock synchronization applications, the ideal error is perfectly zero. When the signal is accurately outputting the desired signal, the PLL has locked.

The theory of compressive sensing indicates that lock should be achieved and maintained under similar conditions as the traditional PLL. As stated earlier, we can assume that θ(t) contains both varying phase and frequency information. If we can obtain lock in a traditional PLL, the correlation between the input and generated signal is returning the desired correlation (zero for clock synchronization, or the message signal in FM demodulation, for example). Because inner products are preserved, the correlation between the compressively sampled input y[m] and compressively sampled oscillator signal v[m] will be very close to the desired output Similarly, by RIP, once loop is locked the correlation of the compressive loop will closely match that of the traditional and thus it will maintain lock similar to a traditional scenerio. Thus the ability to retain lock for a compressive PLL versus a traditional PLL is determined by how accurately the phase correlations of compressive measurements match the correlation of traditional measurements.

Quadrature Compressive Sensing PLL

Classical PLLs aim to drive a signal and an oscillator to be perfectly out of phase with each other. In another possible embodiment of the CS-PLL, which we call the Quadrature CS-PLL (QCS-PLL), we track and estimate parameters by comparing the input signal to two oscillatory signals that are generated to be exactly 90° out of phase, i.e., two quadrature channels. The feedback loop aims to place one generated signal in phase with the input and the other at 90° out of phase. By comparing the phase differences of both signals with the input and by intelligently combining the results, the QCS-PLL design can address certain errors in the model, such as improper normalization of the sampling matrix.

An embodiment of the QCS-PLL is depicted in FIG. 7, which shows oscillators 712, 714, phase detectors 722, 724, phase estimator 726, loop filter 730, compressive sampler 740, and compressive samplers 752, 754. The input signal is correlated with the outputs of two oscillators, y[m] and z[m] to produce two phase estimates a[m] and b[m], respectively. Both correlations are estimated in the compressive domain, i.e. using compressive samples of the signals:

$$a[m] = \sum_k y[k]v_1[k]h_1[m-k] \qquad (22)$$

$$b[m] = \sum_k y[k]v_2[k]h_2[m-k] \qquad (23)$$

where $h_1[-m]$ and $h_2[-m]$ are the inner product kernels. Often $h_1[-m]$ and $h_2[-m]$ will be the same.

The feedback loop aims to make one of the two channels as orthogonal to the input as possible and the other as correlated with the input as possible. The channels need not be designed orthogonal to the input initially, such as −45° and 45°. However an offset like this can just be viewed as an offset of 45° in the input signal, so we suppose without loss of generality that we have 0° and 90°. One of many possible ways to combine the phase estimates is by computing the arctan(·) of the two channels:

$$\hat{\theta}[m] = \arctan(b[m]/a[m]). \qquad (24)$$

The feedback loop can be designed to drive the estimate to 0 or to π/2, i.e., to b[m]=0, a[m]=1, or to b[m]=1, a[m]=0, respectively. For numerical stability in practical implementations the former design might be preferred, although careful implementation avoids the stability problems of the latter design.

Of course, trivial modifications include, but are not limited to, using the inverse ratio to estimate the phase through the arctan(·) function:

$$\hat{\theta}[m] = \arctan(a[m]/b[m]), \qquad (25)$$

or linearizing the arctangent around the origin and using only the ratio to estimate the phase difference:

$$\hat{\theta}[m] = a[m]/b[m], \text{ or } \hat{\theta}[m] = b[m]/a[m]. \qquad (26)$$

One of the advantages of the QCS-PLL over the CS-PLL is that dividing the output of one channel by the other removes any gain constants attributable to the random coefficents in Phi, for example in an unnormalized ±random demodulation scheme.

As with the classical PLL and the CS-PLL, the estimate can be filtered using a loop filter, divided to lock to a different frequency multiples, or otherwise processed before being the input to the oscillators.

In addition to the notes on one embodiment of a CS-PLL in the previous subsection, we note that in the embodiment of the QCS-PLL the signal generation can be combined in one component that produces compressive samples of the signals of both oscillators. This component can be implemented in a number of ways. Some examples are: separate distinct oscillators and distinct compressive samplers, one combined quadrature oscillator and two compressive samples, or a single generator directly producing the output. Additionally, although the motivation of the QCS-PLL is to perform PLL functionality in the compressive domain, the QCS-PLL can be used when the input is a Nyquist-rate uniformly sampled signal. In this case the oscillator generates signals sampled at the Nyquist rate and the compressive samplers are eliminated from the design.

Democracy and CS-PLL/QCS-PLL

In practice, CS measurements are quantized with a finite-range quantizer before they enter the CS-PLL. In some cases, the quantizer may saturate, i.e., measurements that exceed the range T of the quantizer will take the value T. This can result in large measurement error. Furthermore, saturated measurements can make it significantly harder for the CS-PLL to lock on the carrier frequency.

Consider the following extreme example. Suppose we have vector y of length=2. By saturating both elements of y, i.e., y[0]=y[1]=T, the vector is necessarily re-oriented to 45 degrees, regardless of its angle before saturation. Thus, saturation changes the orientation of a vector, and the angle estimate between y and v can be highly inaccurate, so much so that the PLL may not converge.

In an additional embodiment of the CS-PLL and the QCS-PLL, we exploit the democracy property of CS measurements to combat finite range measurements. The adjustment to the design is as follows. The angle estimate $\hat{\theta}[m]$ is computed as before, however, in a time-instance m where a measurement exceeds the threshold, i.e., y[m]>T or y[m]<−T, the angle estimate is not updated. This results in a vector of angle estimates that is no longer uniformly sampled in time. To adjust the final estimate to be on a uniform time sample grid, we may choose from a variety of techniques including, but not limited to, interpolation, resampling, or functional approximation. In some embodiments, we may choose not to alter the output of the CS-PLL or QCS-PLL. Additionally, further processing may be performed directly on the output estimates.

The democracy property of CS measurement systems ensures that if we do not saturate too often, then the sampling system maintains RIP and the preservation of angles is secured. Uniformly sampled PLLs may also drop saturated samples to improve performance. In contrast, by using saturated measurements with the CS- or QCS-PLL, it may take much longer to converge or it may not converge at all.

The above new PLLs can operate with arbitrary locally period signals that are described in terms of a fundamental frequency and phase, including but not limited to square waves, triangle waves, sawtooth waves, etc.

A second order CS- and QCS-PLL embodiment can designed in similar fashion to Christian Stimming, "Frequency offset tracking in mcma systems," Technical report, Berkley Wireless Research Center, May 2001. In this case, we have a loop filter and phase update described by the transfer function $$H(z) = \frac{C_2(z-1) + C_1}{(z-1)^2 + C_2(z-1) + C_1 1} \quad (27)$$

where $C_1 = \omega_n^2$, and $C_2 = 2\zeta\omega_n$. This embodiment can be used to track frequency as opposed to phase in the other designs.

Other variations of the basic PLL design (for example, with a multiplier or a divider inserted into the feedback loop to estimate the phase difference (see D. Banerjee, *PLL Performance, Simulation, and Design*, 4th ed. Dog Ear Publishing, LLC, 2006) that exploit the inner product between signals can be converted to a CS-based design.

EXAMPLES

Signal Demodulation with a Known Carrier Frequency

Frequency modulated (FM) signals are commonly used in analog and digital communications. FM signals encode a signal of interest, r(t) by modulating the phase of a sinusoidal carrier:

$$x(t) = \sin\left(2\pi f_c t + f_\Delta \int_{-\infty}^{t} r(t)dt\right), \quad (28)$$

where $f_c$ is the carrier frequency and $f_\Delta$ is a parameter that controls the spectral occupancy of the FM signal.

In the examples, we demonstrate an FM signal with a carrier frequency $f_c$ that may lie anywhere in a bandwidth of interest significantly larger than the spectral occupancy of the FM signal. We test the case where the remaining bandwidth is free of other signals and contains only background noise. A classical approach in monitoring the whole bandwidth and using a digital PLL to demodulate the FM signal requires sampling at twice the bandwidth of interest where the FM signal may lie. However, since the FM signal is a very sparse signal in this bandwidth, compressive sampling is a promising approach to reduce the sampling rate.

The setup is as follows. We use a random demodulator as the compressive sampler. The kernel h in the PLL was defined as a moving average filter $$h[m] = \begin{cases} 1, & 0 \le m \le L/p - 1 \\ 0, & \text{otherwise}, \end{cases} \quad (29)$$

where, L=128 is a parameter of the system and p is the undersampling rate of the compressive sampler. Furthermore, in the loop filter we set µ=0.01p. We choose the carrier frequency $f_c$ at random. The bandwidth of the message signal is 1.6 kHz, and it is embedded in a larger bandwidth of 10 kHz. We take measurements of the signal at ⅛ of the Nyquist rate for the larger bandwidth. To recover the signal of interest we differentiate the phase estimate of the PLL using a first order difference operator.

In a classical Nyquist-rate PLL the output s[m] would also be computed at the Nyquist rate of the whole bandwidth. With a compressive PLL the output is computed at the significantly lower rate in which the compressive sampler operates. In both cases the output is produced at a higher rate than the Nyquist rate corresponding to the signal of interest s(t), and, therefore, s[m] can be further downsampled without loss of information.

FIGS. 10A-10B demonstrate the results of this experiment. The solid line depicts a portion of the input signal in the time domain. The dashed line depicts the output of conventional PLL sampled at the Nyquist rate. The dash-dotted line depicts our results obtain at ⅛ the Nyquist rate.

Once our system converges, it follows the input signal and the conventional PLL very closely. We admit a small attenuation in the recovered signal, however the rate at which we sampled was significantly below the Nyquist rate. In conventional systems, sampling at this rate would not permit the signal to be recovered.

This experiment demonstrates the feasibility of one of our embodiments. The FM signal can be demodulated using compressive measurements over a large bandwidth.

Carrier Frequency Convergence

In this subsection we demonstrate the frequency locking capability of the CS-PLL embodiment.

The setup is as follows. We use a second order PLL defined by the loop filter equation $$H(z) = \frac{C_2(z-1) + C_1}{(z-1)^2 + C_2(z-1) + C_1} \quad (30)$$

where $C_1 = \omega_n^2$, and $C_2 = 2\zeta\omega_n$. The particular parameters used in our implementation were $$\omega_n = \frac{5}{3}\frac{B_{loop}}{f_s}, \zeta = 1,$$

where $B_{loop}$ represents the desired loop bandwidth, $f_s$ is the sampling frequency. The measurements were taken at one fourth the Nyquist rate (i.e., M=1/(4N)). To compare results, the filter designed for the traditional PLL was taken with $f_s$=16.384 MHz, but since the CS-PLL was operating at one-fourth the rate, $\omega_n$ was recomputed for $f_s$=16.384/4 MHz, and the new filter was implemented. An FM message signal was used, with a random unit magnitude spectrum from roughly 100 Hz to 3400 Hz with a narrow deep notch, and stopband everywhere else. The oscillator frequency was adjusted to be 98% of the FM center frequency, which was varied over trials. The output message after digital differentiation of a traditional PLL and the subsampled system were compared to the input.

FIGS. 11A-11B demonstrate the results of this experiment. Specifically, in FIG. 11A, we display the input signal as a red solid line, the output of a conventional PLL as a blue dashed line, and the output of the CS-PLL at ¼ Nyquist rate as the green dash-dotted line. The plot depicts the signal amplitude versus the time (in samples).

Both the conventional PLL and the CS-PLL converge with fewer than 1×10⁴ samples, with the CS-PLL taking slightly longer to converge. Convergence means that we are properly demodulating the input signal. In this plot, convergence is occurring when the demodulated signals are hovering around amplitude 43. The offset in amplitude is due to error in our original estimate of the carrier frequency. To demonstrate that the recovered signal is in fact correct, we display a zoomed in version of the plot in FIG. 11B.

Saturation and Democracy

Democracy as discussed in section was also applied to the PLL. As in the case of testing the PLL frequency locking ability, we use a second order filter with the same transfer function. This time we use $f_s$=2.048 MHz and fix the FM center frequency at 800 kHz, but we continue to design the filters in the same fashion (with the adjusted sample rate parameter) and set the oscillator frequency at 98% of the FM center frequency. We again apply Nyquist sampling and compressive sampling with one-fourth the measurements. The signal follows the same description as above. The single channel system design (CS-PLL) was used here.

Two output signals are created, one in which the samples are allowed to saturate with any saturating samples are assigned the limit value, and another where saturating samples are dropped as explained in the democracy section. This implies for our PLL that the time index is incremented (we are still aware of when the measurement was taken), but but no stored values, (ie in the integrator) are changed. Note: a simple first order digital differentiator model is used to return the message; in the case when points are dropped due to democracy, the two difference points that would be computed from each dropped point (i.e. the difference between the dropped point and the previous point as well as the difference between the dropped point and the previous point) are ignored. This model does not affect the operation of the PLL as it occurs on an output of the feedback loop and while non-uniform filtering or other models could be used, the model is sufficient for justifying convergence.

The trends are demonstrated in the plots in FIG. 12. The PLL continues to converge when dropping saturated measurements except under heavy saturation. Under low thresholds, i.e., high saturation rates, it takes more time to converge when dropping saturated measurements than using the saturated measurements. If the saturation rate is too high, it will not converge at all. For low saturation levels, it converges slightly quicker. FIG. 12A demonstrates a threshold of 0.2, and while the signal being tracked with democracy measurements moves slightly towards lock, it is dropping so many measurements that it cannot. In FIG. 12B, using saturation converges slightly faster than democracy. FIG. 12C demonstrates a threshold of 1.44; here the signal actually converges slightly faster using democracy than if saturation is allowed. We zoom in on plots B and C to show the difference in convergence more clearly.

The CS-PLL and the QCS-PLL designs can be used in any application in which a PLL is useful. The main advantage in comparison to a classical PLL is the reduced rate of operation if a compressive sampler can be used, i.e., if the spectral occupancy of the input is relatively small compared to the acquired bandwidth.

The usage of a compressive sampler in the feedback loop is the critical difference between our designs and traditional PLLs. The fundamental principle that enables a PLL implementation in the compressive domain is Eq. 10. This guarantees that compressive sampling of signals maintains the geometry of the signal space in the compressive domain. Thus our designs are able to maintain the fundamental PLL building blocks and operate them at a significantly lower rate compared to a classical PLL.

A further novelty of the QCS-PLL design is the introduction of the second channel, which is 90° out of phase with the primary channel of the classical PLL or the CS-PLL. The intelligent combination of information from two channels instead of one enables one to handle things such as unnormalization of the sampling system. An important component of this design is how the combination of the two estimates is performed. The design choice balances trade-offs in loop stability, numerical stability, accuracy of approximation, and computational efficiency. Some examples are discussed in Sec. 4.2.

The emphasis in the system design has been placed on low-cost and low sampling rate operation. Still, the design mimics the fundamental design of a classical PLL. Since a PLL is a widely used signal processing component, a number of variations exist and can be used in a straightforward manner using compressive domain samples. For example, the inner product kernel h[−m] and the loop filter design can be modified depending on the application requirements.

An assumption of classical PLL designs is that the central frequency $f_c$ is approximately known during the operation of the PLL. Besides using a second order PLL to track frequency, another design that is sometimes used a dual PLL (see C. R. J. Jr and W. A. Sethares, *Telecommunication Breakdown*. Prentice Hall, 2004). In this setup, two loops are run in parellel with oscillators, with each one the same as before except that the first passes phase information to the second. The phase generated from the first loop is added to phase output from the loop filter of the second loop. The first loop in essence tracks phase for the second loop. This modification can be applied in a straightforward way to the CS-PLL or the QCS-PLL, as the phase detector component remains the same. If the inner product is preserved in the first loop it passes the correct frequency information to the second, which also would have a good correlation measure independent of the first loop if its inner product was also preserved. The second loop only affects the final phase update. See FIG. 13 for diagram of the original dual PLL, and FIG. 14 for its compressive sensing counterpart.

Although the oscillators in our designs are sinusoidal, other oscillators can also be used to better match the input signal, depending on the application. These include, but are not limited to, square, sawtooth, and triangle waveforms.

The CS-PLL and QCS-PLL are applicable to many of the same signal processing problems where a traditional PLL is used on Nyquist-rate data. There are tradeoffs to consider when choosing whether a PLL will be driven with either real or complex input. This holds true for the traditional, CS-PLL and QCS-PLL. Using complex data generally increases the SNR, while a real PLL may be easier to implement. In the ideal case we would like to work directly with complex data. However this implies taking compressive measurements of the complex FM signal. We cannot convert to complex data using a digital Hilbert transform after taking measurements; these operations do not commute. Generally, however, even if complex data is used in a PLL, real data is actually obtained at the receiver and the data is converted to complex after the traditional analog-to-digital conversion. The conversion can be done in analog hardware at the antenna and if this is done or complex FM data is obtained in another manner we can utilize the performance boost, though an analog Hilbert transformer has its own drawbacks.

FM modulation is prone to larger noise at higher frequencies. Typical FM demodulators use a low-pass filter to de-emphasize this high frequency noise. So that the message signal's high-frequency components are not diminished relative to the low-frequency components, the FM transmitter pre-emphasizes those high-frequency components. The overall effect of this compensation strategy is that the message signal maintains its original power spectrum while high frequency noise is reduced.

For the CS-PLL and QCS-PLL, we allow the input signal to be pre-emphasized if desired for an application. The CS-PLL and QCS-PLL operate with similar disadvantages as the traditional PLL and will add noise at higher frequencies. The uses of a pre-emphasizer does not directly require modifications to the CS-PLL or QCS-PLL and a de-emphasizer can still be used on the output of the CS-PLL. We will continue to use the same sequence for the random demodulator or other compressive sampler as we do for the model in the feedback loop. The same loop filter can be used.

Similar to the traditional PLL case, the de-emphasis circuit should invert the frequency response of the pre-emphasis circuit. However, the major distinction between the output of the traditional and CS-PLLs and QCS-PLLs is that the signal is now at the lower (compressed) rate. Thus when designing the de-emphasis circuit, we would design the filter to operate at this new rate.

Phase-lock loops are designed to lock onto a relatively narrowband signal. Because we often have an estimate of the carrier frequency we can easily apply a traditional bandpass filter around the signal of interest when applying a traditional PLL. If we know the location in the spectrum of the signal before acquiring with the compressive sampler, we could apply an analog bandpass filter as in the traditional case and proceed with processing through a CS-PLL or QCS-PLL. However, the motivations for using CS often preclude filtering beforehand. This may be because we do not know initially where any signal or inteferer is, but find out later. Alternatively, we may wish to monitor the entire spectral band with the same set of data while using the PLL in parallel with other processing. Filtering of the compressive sampled data can also be done as shown in M. A. Davenport, P. T. Boufounos, and R. G. Baraniuk, "Compressive Domain Interference Cancellation", in *Workshop on Signal Processing with Adaptive Sparse Structured Representations (SPARS)*, Saint-Malo, France, April 2009. We can decompose the signal x as $x=x_S+x_I$, where $x_S$ is the desired signal and $x_i$ is interference noise The procedure is different from standard bandpass filtering. Rather than design taps to implement an FIR or IIR filter for a given sampling frequency, a projection matrix is computed that will map the spectral components of the interfering signal to the nullspace. In essence we are removing columns of the sampling matrix $\Phi\Psi$ that correspond to the unwanted components. The interference cancellation matrix is written as $$P = I - \Phi_J \Phi_J^\dagger, \quad (31)$$

where $\Phi_J^\dagger$ denotes the pseudoinverse $\Phi_J^\dagger = (\Phi_J^* \Phi_J)^{-1} \Phi_J^*$. In this instance $\Phi$ must include the basis transform to the frequency domain, not just the random demodulator'±1 structure.

The projection matrix P may be dense. The density would imply that a block-wise algorithm is necessary, making it very difficult to implement interference cancellation in real time. Given the way the CS-PLL and QCS-PLL were constructed by added a compressive sampler after the oscillator, it would suggest that the cancellation matrix P could be added to the loop after the sampler. Because P cannot easily be implemented on a per-sample basis like the random demodulator, this would introduce inordinate amount of delays in the loop. In most instances, we drop P from the loop. Fortunately, dropping the matrix results in minimal error for compressive sensing systems with low RIP constants δ. In M. A. Davenport, J. N. Laska, P. T. Boufounos, and R. G. Baraniuk, "A Simple Proof that Random Matrices are Democratic", November 2009. [Online], it is shown that $$\frac{\|(I-P)\Phi x_S\|}{\|\Phi x_S\|} \leq \frac{\delta}{1-\delta} \quad (32)$$

for the RIP constant δ of matrix $\Phi$ and desired signal $x_S$. The RIP constant of the $\Phi$ must be $O(K_S+K_I)$, where $K_S$ is the sparsity of the desired signal support and $K_I$ is the sparsity of the interference signal. Hence, while the interference signal will be removed by applying the projection matrix, the norm of the new signal support components differs at most from the original by a factor of δ/1−δ. A scalar gain could be handled simply enough in the feedback loop, but support components must otherwise not be modified.

Furthermore, if we know the signal support of interest, we can actually design matrices that focus solely on eliminating the interference signal and preserving the signal support of interest. This would mean that we may slightly increase error in spectral components that do not lie in either the support or interference bands, but the assumption is that the original components will be minimal beforehand and thus the effect may not be significant. We solve a set of equations $$P[\Phi_{T_I} \Phi_{T_S}] = [0 I], \quad (33)$$

where $T_I$ and $T_S$ refer to the set of columns defining the support of the interference and desired signal respectively. $\Phi_{T_I}$ and 0 are $M \times K_I$ matrices, while $\Phi_{T_S}$ and I are $M \times K_I$. We have an undetermined system of $M^2$ unknowns with $M \times (K_I + K_S)$ constraints (we assume $M > (K_I + K_S)$ as otherwise the original assumption of RIP and preservation of inner products do not hold. The flexibility in choosing P in the undetermined system could allow us to further restrict the effects of P on spectral components outside the desired signal and interference bands. We can overestimate the support of our signal and take a few more measurements if we have knowledge of only an approximate band of support when applying this method.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for estimating and tracking locally oscillating signals, the method comprising the steps of:
  acquiring compressive samples of a locally oscillating analog or digital input signal with a first compressive sampler;
  computing an estimate of parameters of the input signal from inner products of said acquired compressive samples with compressive samples of an estimated output;

generating said estimated output with an oscillator, where said estimated output comprises samples of said estimated parameters; and converting with a second compressive sampler said samples of said estimated parameters into said compressive samples of said estimated output.

2. A method according to claim 1 wherein said step of acquiring compressive samples of said input signal is linear.

3. A method according to claim 1 wherein said step of acquiring compressive samples of said input signal is non-linear.

4. A method according to claim 2 wherein said step of acquiring compressive samples of said input signal is nonadaptive.

5. A method according to claim 1, wherein step of acquiring compressive samples of said input signal comprises projection using one of a random matrix, a pseudorandom matrix, a sparse matrix and a code matrix.

6. A method according to claim 5, further comprising the step of tracking said input signal with a phased-lock loop operating on compressively sampled data.

7. A method according to claim 5, further comprising the step of tracking phase and frequency of an input signal by operating on compressively sampled frequency modulated data, tracking phase and frequency.

8. A method according to claim 1, wherein said step of acquiring compressive samples of said input signal comprises taking measurements using one of a random demodulator, a random sampler, and another compressive sensing sensor.

9. A method according to claim 8, wherein said step of computing an estimate comprises estimating the parameters with a feedback loop.

10. A method according to claim 1 wherein the input signals are locally periodic signals with time-varying fundamental frequency and/or phase.

11. A method according to claim 1 wherein the input signals are sinusoids with time varying frequency and/or phase.

12. A method according to of claim 1 wherein said step of computing an estimate of the parameters comprises estimating the parameters with a single feedback loop.

13. A method according to claim 12 wherein said single feedback loop operates in real-time.

14. A method according to claim 1 wherein the step of acquiring compressive samples of said input signal comprises a linear measurement technique and said linear measurement technique is a stable embedding between a class of signals of interest.

15. A method according to claim 14 wherein said linear measurement technique is nonadaptive.

16. A system for estimating and tracking locally oscillating signals, the system comprising:
   a first compressive sampler for acquiring samples of a locally oscillating analog or digital input signal;
   means for computing an estimate of a parameters of the input signal, said means for computing having an input connected to out output of said first compressive sampler;
   an oscillator connected to an output of said means for computing; and
   a second compressive sampler having an input connected to an output of said oscillator and an output connected to an input of said means for computing; wherein,
   said oscillator generates an estimated output of said means for computing, said estimated output comprising samples of said estimated parameters;
   said second compressive sampler converts said samples of said estimated parameters into compressive samples of said estimated output; and
   said means for computing computes an estimate of parameters of the input signal from inner products of said acquired compressive samples with compressive samples of an estimated output.

17. A system for estimating and tracking locally oscillating signals according to claim 16, further comprising a loop filter connected between said means for computing and said oscillator.

18. A system for estimating and tracking locally oscillating signals according to claim 16, wherein said means for computing comprises a phase detector.

* * * * *